US012777807B2

(12) United States Patent

Kim et al.

(10) Patent No.: US 12,777,807 B2

(45) Date of Patent: Oct. 27, 2026

(54) PIXEL AND DISPLAY DEVICE COMPRISING THE SAME

(71) Applicant: Samsung Display Co., LTD., Yongin-si (KR)

(72) Inventors: Tae Ho Kim, Yongin-si (KR); Hyeo Ji Kang, Yongin-si (KR); Oh Jeong Kwon, Yongin-si (KR); Su Jeong Kim, Yongin-si (KR); Mi Hwa Lee, Yongin-si (KR); Hong Yeon Lee, Yongin-si (KR); Sung Gyu Jang, Yongin-si (KR); Seung Yeon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 327 days.

(21) Appl. No.: 18/493,845

(22) Filed: Oct. 25, 2023

(65) Prior Publication Data

US 2024/0155910 A1 May 9, 2024

(30) Foreign Application Priority Data

Nov. 9, 2022 (KR) ........................ 10-2022-0148923

(51) Int. Cl.

*H10K 59/38* (2023.01)

*H10K 59/122* (2023.01)

(Continued)

(52) U.S. Cl.

CPC ........... *H10K 59/38* (2023.02); *H10K 59/122* (2023.02); *H10K 59/35* (2023.02); *H10K 59/873* (2023.02); *H10K 59/879* (2023.02)

(58) Field of Classification Search

CPC .. H10K 59/38; H10K 59/8792; H10K 59/122; H10K 59/35; H10K 59/873;

(Continued)

(56) References Cited

U.S. PATENT DOCUMENTS 8,087,964 B2 1/2012 Yang et al.

10,388,913 B2 8/2019 Jung et al.

(Continued)

FOREIGN PATENT DOCUMENTS

JP 2007-149693 6/2007

JP 2009-271227 11/2009

(Continued)

*Primary Examiner* — Alia Sabur

(74) *Attorney, Agent, or Firm* — Womble Bond Dickinson (US) LLP

(57) ABSTRACT

A pixel includes first, second, and third sub-pixels each including an emission area and a non-emission area. Each of the first, second, and third sub-includes a pixel circuit layer; a first electrode on the pixel circuit layer; a pixel defining layer on the first electrode and including an opening to expose an area of the first electrode; an emission layer on the pixel defining layer; a second electrode on the emission layer; a thin film encapsulation layer over the second electrode; a color filter on the thin film encapsulation layer; and an overcoat layer over the color filter. The overcoat layer has a refractive index greater than a refractive index of the color filter. A color filter of the second sub-pixel overlaps a color filter of each of the first and third sub-pixels in the non-emission area.

18 Claims, 11 Drawing Sheets

(51) Int. Cl.
*H10K 59/35* (2023.01)
*H10K 59/80* (2023.01)

(58) Field of Classification Search
CPC .. H10K 59/879; H10K 59/878; H10K 59/123; H10K 50/844; H10K 50/858; H10K 59/131; H10K 59/8051; H10K 59/8052; H10K 59/877; H10K 77/10; G02F 1/133514
See application file for complete search history.

(56) References Cited

U.S. PATENT DOCUMENTS

| | | | | |
|---|---|---|---|---|
| 2019/0305050 | A1* | 10/2019 | Ishizuya | H10K 59/38 |
| 2019/0305051 | A1* | 10/2019 | Takahashi | H10K 59/35 |
| 2020/0343310 | A1* | 10/2020 | Bae | H10K 59/352 |
| 2021/0074953 | A1 | 3/2021 | Kim | |
| 2022/0069014 | A1 | 3/2022 | Choi et al. | |
| 2022/0077253 | A1 | 3/2022 | Yang et al. | |
| 2022/0199698 | A1 | 6/2022 | Son et al. | |
| 2024/0049552 | A1 | 2/2024 | Kim et al. | |
| 2024/0107848 | A1* | 3/2024 | Wu | H10K 59/126 |

FOREIGN PATENT DOCUMENTS

| | | |
|---|---|---|
| KR | 10-2009477 | 8/2019 |
| KR | 10-2022-0030367 | 3/2022 |
| KR | 10-2022-0088545 A | 6/2022 |
| KR | 10-2433274 | 8/2022 |

* cited by examiner

PIXEL AND DISPLAY DEVICE COMPRISING THE SAME

CROSS-REFERENCE TO RELATED APPLICATION(S)

This application claims priority to and benefits of Korean patent application No. 10-2022-0148923 under 35 U.S.C. § 119 filed on Nov. 9, 2022, in the Korean Intellectual Property Office, the entire contents of which are incorporated herein by reference.

BACKGROUND

1. Technical Field

The disclosure generally relates to a pixel and a display device comprising the same.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a pixel having improved light emission efficiency and improved manufacturing efficiency.

Embodiments also provide a display device comprising the above-described pixel.

The technical objectives to be achieved by the disclosure are not limited to those described herein, and other technical objectives that are not mentioned herein would be clearly understood by a person skilled in the art from the description of the disclosure.

In accordance with an aspect of the disclosure, there is provided a pixel that may include a first sub-pixel, a second sub-pixel, and a third sub-pixel each including an emission area and a non-emission area. Each of the first sub-pixel, the second sub-pixel, and the third sub-pixel may include a pixel circuit layer disposed on a substrate; a first electrode disposed on the pixel circuit layer; a pixel defining layer disposed in the non-emission area, the pixel defining layer including an opening disposed on the first electrode to expose an area of the first electrode, corresponding to the emission area; an emission layer disposed on the pixel defining layer; a second electrode disposed on the emission layer; a thin film encapsulation layer disposed over the second electrode; a color filter disposed on the thin film encapsulation layer; and an overcoat layer disposed over the color filter. The overcoat layer has a refractive index greater than a refractive index of the color filter. A color filter of the second sub-pixel overlaps a color filter of each of the first sub-pixel and the third sub-pixel in the non-emission area.

The color filter may include a monomer containing fluorine and silica.

The color filter may have a refractive index in a range of about 1.4 to about 1.55, and the overcoat layer may have a refractive index in a range of about 1.55 to about 1.7.

The color filter of the second sub-pixel may include a first end portion disposed on the color filter of the first sub-pixel in the non-emission area and a second end portion facing the first end portion and disposed on the color filter of the third sub-pixel. A width of each of an overlapping area of the first end portion and the color filter of the first sub-pixel and an overlapping area of the second end portion and the color filter of the third sub-pixel may be about equal to or greater than a value obtained by subtracting about 0.6 μm from a width of the pixel defining layer and may be about equal to or less than a value obtained by adding about 0.2 μm to the width of the pixel defining layer.

Each of the first end portion and the second end portion of the color filter of the second sub-pixel may have a height of about 1 μm or more in each of the overlapping areas.

Each of the first end portion and the second end portion may have a side slope angle in a range of about 60 degrees to about 90 degrees.

The substrate may include a silicon wafer substrate.

The pixel circuit layer may include a gate insulating layer; a gate electrode disposed on the gate insulating layer; and source and drain regions disposed at sides of the gate electrode in the substrate.

Each of the first sub-pixel, the second sub-pixel, and the third sub-pixel may further include a conductive pattern disposed on the pixel circuit layer; a via layer disposed between the conductive pattern and the first electrode; and a via plug contacting the conductive pattern while penetrating the via layer. The via plug may be electrically connected to the first electrode.

The color filter of the first sub-pixel may include one color filter among a red color filter, a green color filter, and a blue color filter. The color filter of the second sub-pixel may include another color filter among the red color filter, the green color filter, and the blue color filter. The color filter of the third sub-pixel may include the other color filter among the red color filter, the green color filter, and the blue color filter.

The substrate may include a transparent insulative material.

An emission layer of the first sub-pixel may emit light of a first color. An emission layer of the second sub-pixel may emit light of a second color, different from the light of the first color. An emission layer of the third sub-pixel may emit light of a third color, which is different from the light of the second color. The emission of the first sub-pixel, the emission layer of the second sub-pixel, and the emission layer of the third sub-pixel may be spaced apart from each other.

Each of the first sub-pixel, the second sub-pixel, and the third sub-pixel may further include a bank disposed on the thin film encapsulation layer in the non-emission area; and a color conversion pattern disposed on the thin film encapsulation layer in the emission area, the color conversion pattern being surrounded by the bank.

In accordance with another aspect, there is provided a display device that may include a substrate including an emission area and a non-emission area; a pixel circuit layer disposed on the substrate; a (1-1)th electrode, a (1-2)th electrode, and a (1-3)th electrode, disposed on the pixel circuit layer, the (1-1)th electrode, the (1-2)th electrode, and the (1-3)th electrode, spaced apart from each other; a pixel defining layer disposed over the (1-1)th electrode, the (1-2) th electrode, and the (1-3)th electrode, the pixel defining layer including an opening exposing an area of each of the (1-1)th electrode, the (1-2)th electrode, and the (1-3)th electrode in the emission area; an emission layer disposed on the (1-1)th electrode, (1-2)th electrode, and (1-3)th electrode exposed by the openings, a side of the pixel defining layer, and a top of the pixel defining layer; a second electrode disposed on the emission layer; a thin film encapsulation layer disposed over the second electrode; a color filter layer disposed on the thin film encapsulation layer, the color filter layer including a first color filter corresponding to the (1-1)th electrode, a second color filter corresponding to the (1-2)th electrode, and a third color filter corresponding to the (1-3)th electrode; and an overcoat layer disposed over the color filter layer. The overcoat layer has a refractive index greater than a refractive index of each of the first color filter, the second color filter, and the third color filter. Two color filters disposed adjacent to each other in the non-emission area overlap each other.

The first color filter, the second color filter, and the third color filter may include a monomer containing fluorine and silica.

Each of the first color filter, the second color filter, and the third color filter may have a refractive index in a range of about 1.4 to about 1.55, and the overcoat layer may have a refractive index in a range of about 1.55 to about 1.7.

The second color filter may include a first end portion disposed on the first color filter in the non-emission area and a second end portion facing the first end portion and disposed on the third color filter. A width of each of an overlapping area of the first end portion and the first color filter and an overlapping area of the second end portion and the third color filter may be about equal to or greater than a value obtained by subtracting about 0.6 μm from a width of the pixel defining layer and be about equal to or less than a value obtained by adding about 0.2 μm to the width of the pixel defining layer.

Each of the first end portion and the second end portion of the second color filter may have a height of about 1 μm or more in each of the overlapping areas.

Each of the first end portion and the second end portion may have a side slope angle in a range of about 60 degrees to about 90 degrees.

The substrate may include a silicon wafer substrate.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art in which.

DETAILED DESCRIPTION OF THE EMBODIMENTS

Figure 1:
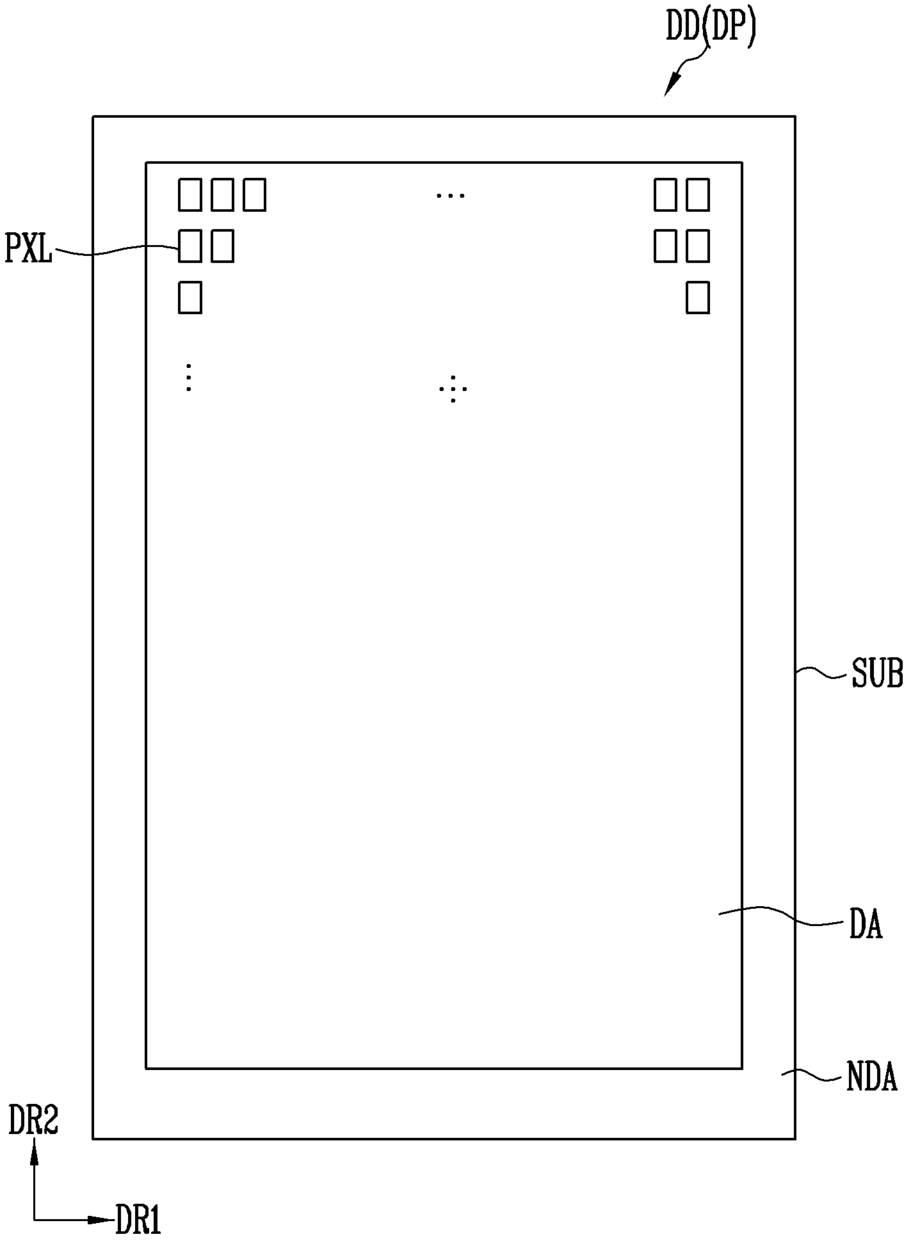
FIG. 1 is a schematic plan view schematically illustrating a display device in accordance with an embodiment.

The disclosure may apply various changes and different shapes, and therefore illustrate examples. However, the examples are not limited to the disclosed shapes but apply to all changes and equivalents.

Like numbers refer to like elements throughout. In the drawings, the thickness of certain lines, layers, components, elements or features may be exaggerated for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. Also, in this specification, the term "connection" or "coupling" may inclusively mean connection or physical and/or electrical coupling.

Hereinafter, embodiments required for those skilled in the art to readily understand the content of the disclosure will be described in detail with reference to the accompanying drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view schematically illustrating a display device DD in accordance with an embodiment.

In FIG. 1, for convenience of description, a structure of the display device DD, by way of example, the display panel DP provided in the display device DD is briefly illustrated based on a display area DA in which an image is displayed.

Referring to FIG. 1, the display device in accordance with an embodiment may include a substrate SUB, pixels PXL disposed on the substrate SUB, a driver which is provided on the substrate SUB and drives the pixels PXL, and a line part connecting the pixels PXL and the driver to each other.

The substrate SUB may be a silicon wafer substrate formed using a semiconductor process. The substrate SUB may include a semiconductor material, for example, a Group IV semiconductor, a Group III-V compound semiconductor, or a Group II-VI compound semiconductor, but the disclosure is not limited thereto. In an embodiment, the substrate SUB may include a transparent insulative material capable of allowing light to be transmitted therethrough. For example, the substrate SUB may be a rigid substrate or a flexible substrate.

One area or an area on the substrate SUB may be provided as the display area DA such that the pixels PXL are disposed therein, and the other area on the substrate SUB may be provided as a non-display area NDA. For example, the substrate SUB may include the display area DA including pixel areas in which the respective pixels PXL are disposed and the non-display area NDA disposed at at least one side or a side of the display area DA (or adjacent to the display area DA).

The display area DA may have various shapes. For example, the display area DA may be provided in various shapes such as a closed polygonal including linear sides, a circle, an ellipse or the like, including a curved side, and a semicircle, a semi-ellipse or the like, including linear and curved sides.

The non-display area NDA may be provided at at least one side or a side of the display area DA. For example, the non-display area NDA may surround a circumference of the display area DA.

The pixels PXL may be provided in the display area DA of the substrate SUB, and be electrically connected to lines.

Each of the pixels PXL may include a light emitting element emitting white light and/or colored light and a pixel circuit for driving the light emitting element. The pixel circuit may include at least one transistor electrically connected to the light emitting element. Each pixel PXL may emit light of any one color among red, green, and blue. However, the disclosure is not limited thereto, and each pixel PXL may emit light of one color among cyan, magenta, yellow, and white.

The pixels PXL may be arranged (or disposed) in a matrix form along rows extending in a first direction DR1 and columns extending in a second direction DR2 intersecting the first direction DR1. However, the arrangement form of the pixels PXL is not particularly limited, and the pixels PXL may be arranged in various forms.

The driver may provide a signal to each pixel PXL through the line part, and accordingly, driving of each pixel PXL can be controlled. The driver may supply a data signal corresponding to an image data signal to the pixels PXL while sequentially scanning the pixels PXL of the display area DA. The display device DD may display an image corresponding to image data.

Figure 2:
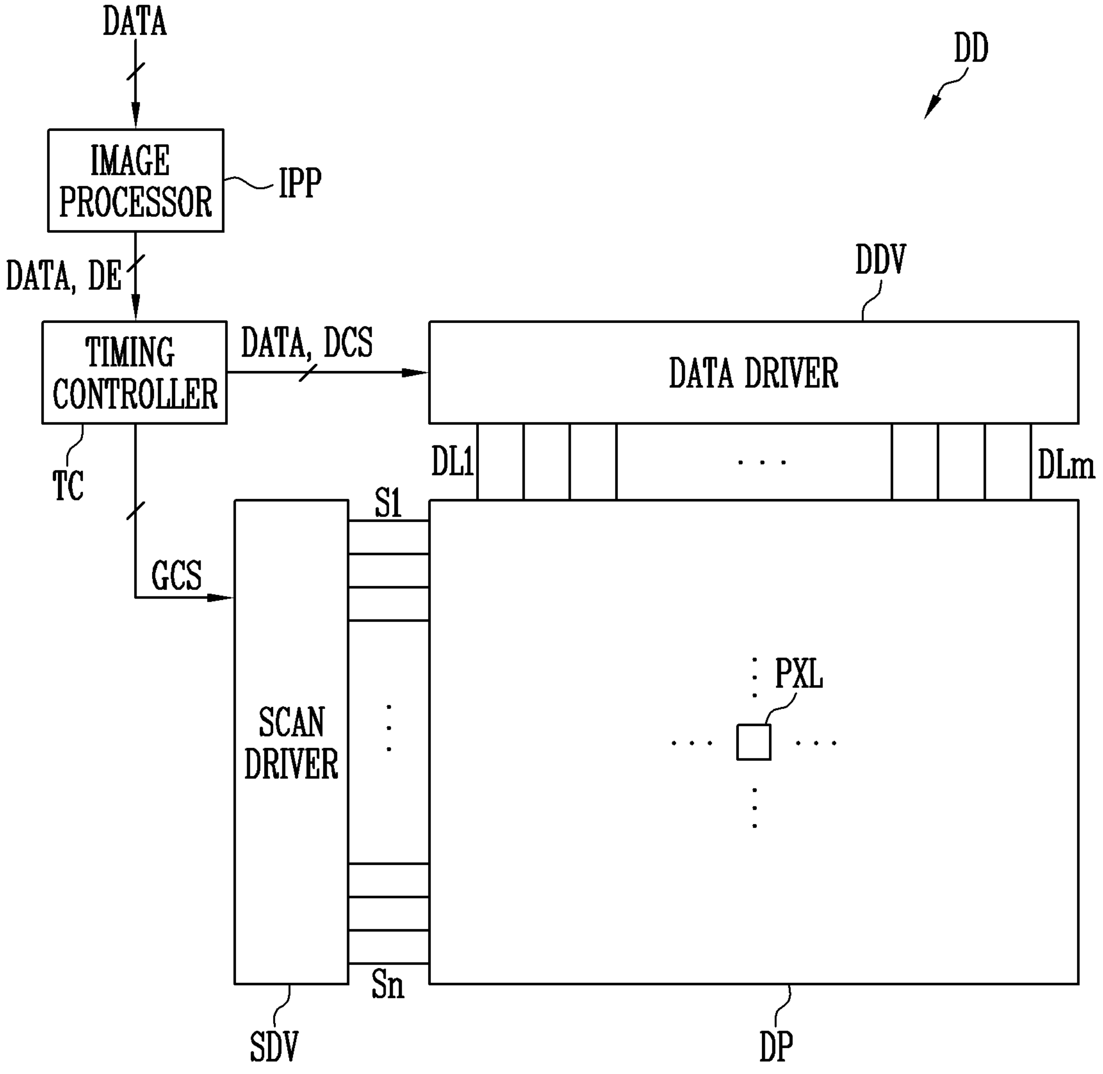
FIG. 2 is a schematic block diagram illustrating an embodiment of pixels and a driver in a display device in accordance with an embodiment.

FIG. 2 is a schematic block diagram illustrating an embodiment of pixels PXL and a driver in a display device DD in accordance with an embodiment.

Referring to FIGS. 1 and 2, the display device in accordance with an embodiment may include a display panel DP, a driver, and a line part.

The display panel DP may display an image, corresponding to a data signal DATA and a scan signal, which are supplied from a data driver DDV and a scan driver SDV. The display panel DP may include pixels PXL for displaying the image.

The driver may include an image processor IPP, a timing controller TC, the data driver DDV, and the scan driver SDV.

The image processor IPP may output a data enable signal DE and the like together with a data signal DATA supplied from the outside. The image processor IPP may output at least one of a vertical synchronization signal, a horizontal synchronization signal, and a clock signal, in addition to the data enable signal DE.

The timing controller TC may receive the data enable signal DE or a driving signal including the vertical synchronization signal, the horizontal synchronization signal, the clock signal, and the like, and the data signal DATA, which are supplied from the image processor IPP. The timing controller TC may output a gate control signal GCS for controlling an operation timing of the scan driver SDV and a data control signal DCS for controlling an operation timing of the data driver DDV, based on the driving signal.

The data driver DDV may convert a data signal DATA signal DATA supplied from the timing controller TC into a corresponding data voltage and output the data voltage in response to the data control signal DCS supplied from the timing controller TC. The data driver DDV may supply the data voltage to data lines DL1 to DLm. The data voltage supplied to the data lines DL1 to DLm may be supplied to pixels PXL selected by a scan signal.

The scan driver SDV may apply a scan signal to scan lines S1 to Sn in response to the gate control signal GCS supplied from the timing controller TC. For example, in case that the scan driver SDV sequentially supplies the scan signal to the scan lines S1 to Sn, the pixels PXL may be sequentially selected in units of horizontal lines.

Figure 3:
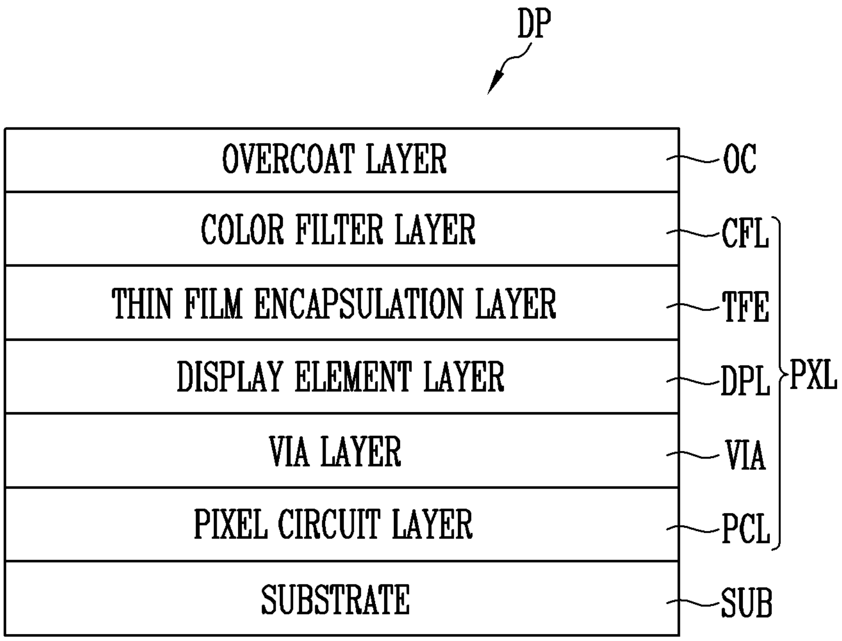
FIG. 3 is a schematic cross-sectional view illustrating a display panel in accordance with an embodiment.
Figure 4:
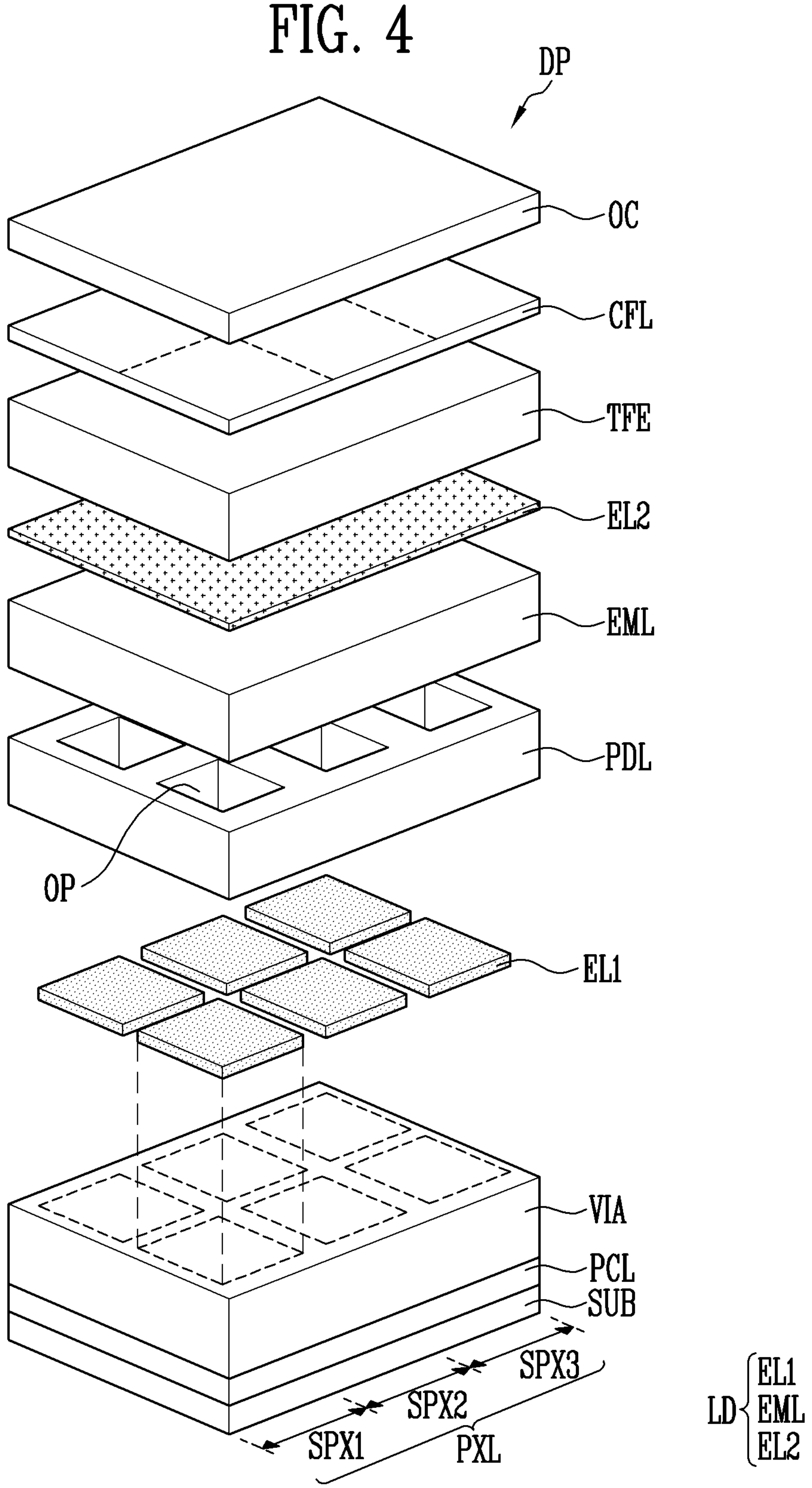
FIG. 4 is a schematic exploded perspective view illustrating a display panel in accordance with an embodiment.

FIG. 3 is a schematic sectional view illustrating a display panel DP in accordance with an embodiment. FIG. 4 is a schematic exploded perspective view illustrating a display panel DP in accordance with an embodiment.

In relation to embodiments shown in FIGS. 3 and 4, portions different from those of the above-described embodiment will be described to avoid redundancy.

Referring to FIGS. 1 to 4, the display panel DP may include a substrate SUB, pixels PXL, and an overcoat layer OC.

Each of the pixels PXL may include sub-pixels SPX1, SPX2, and SPX3. For example, each pixel PXL may include a first sub-pixel SPX1, a second sub-pixel SPX2, and a third sub-pixel SPX3, which are arranged adjacent to each other, but the disclosure is not limited thereto. In an embodiment, each pixel PXL may include four sub-pixels or include two sub-pixels.

Each of the pixels PXL may include a pixel circuit layer PCL, a via layer VIA, a display element layer DPL, a thin film encapsulation layer TFE, and a color filter layer CFL, which are sequentially located (or disposed) on the substrate SUB.

The pixel circuit layer PCL may be disposed on the substrate SUB, and include circuit elements and at least one insulating layer located between the circuit elements. The circuit elements may include transistors and signal lines connected to the transistor. For example, the transistor may be a MOSFET, but the disclosure is not limited thereto. The circuit element may include, for example, a gate electrode, source or drain regions, and a channel region.

The via layer VIA may be selectively disposed on the pixel circuit layer PCL. The via layer VIA may be disposed on the pixel circuit layer PCL to cover the pixel circuit layer PCL. The via layer VIA may be selectively provided according to a material of the substrate SUB. For example, in case that the substrate SUB is a silicon wafer substrate, the via layer VIA may have a resonant structure so as to improve the extraction efficiency of light emitted from the display element layer DPL. The via layer VIA may be partially opened to include a via hole, and the circuit element of the pixel circuit layer PCL and a first electrode EL1 of the display element layer DPL may be electrically connected to each other through a via plug disposed inside the via hole. In an embodiment, in case that the substrate SUB may include a transparent insulating material such as glass or plastic, the via layer VIA may be provided in the form of one of the insulating layers included in the pixel circuit layer PCL or be omitted.

The display element layer DPL may be disposed on the via layer VIA. The display element layer DPL may include a light emitting element LD and a pixel defining layer PDL. The light emitting element LD may be located in each of the first, second, and third sub-pixels SPX1, SPX2, and SPX3. The light emitting element LD may include the first electrode EL1, an emission layer EML, and a second electrode EL2. The first electrode EL1 may be an anode of the light emitting element LD, and the second electrode EL2 may be a cathode of the light emitting element LD.

In each of the first, second, and third sub-pixels SPX1, SPX2, and SPX3, holes injected from the first electrode EL1 and electrons injected from the second electrode EL2 may be transported into the emission layer EML to for an exciton. In case that the exciton is changed from an excited state to a ground state, light may be generated and emitted in the form of visible rays.

The first electrode EL1 may be disposed on the via layer VIA. The first electrode EL1 may include a transparent conductive material capable of allowing light to be transmitted therethrough, but the disclosure is not limited thereto. In an embodiment, the first electrode EL1 may include an opaque conductive material having a reflexibility at which light can be reflected.

The pixel defining layer PDL may be located on the first electrode EL1. The pixel defining layer PDL may include an opening OP exposing one area or an area of the first electrode EL1.

The emission layer EML may be located on the first electrode EL1 exposed by the opening OP of the pixel defining layer PDL. Also, the emission layer EML may be located on a side and a top of the pixel defining layer PDL. The emission layer EML may be a common layer commonly provided in the first, second, and third sub-pixels SPX1, SPX2, and SPX3, but the disclosure is not limited thereto. The emission layer EML may include a light generation layer emitting light, an electron transport layer, a hole transport layer, and the like within the spirit and the scope of the disclosure.

The second electrode EL2 may be located on the emission layer EML, thereby covering the emission layer EML. The second electrode EL2 may be a common layer commonly provided in the first, second, and third sub-pixels SPX1, SPX2, and SPX3.

The thin film encapsulation layer TFE may be located over the second electrode EL2. The thin film encapsulation layer TFE may cover the second electrode EL2, thereby preventing oxygen and/or moisture from infiltrating into the light emitting element LD.

The color filter layer CFL may be located on the thin film encapsulation layer TFE. The color filter layer CFL may allow light emitted from the light emitting element LD to be selectively transmitted therethrough in an image display direction (or front direction) of the display device DD.

The overcoat layer OC may be disposed on the pixels PXL having the above-described configuration. The overcoat layer OC may cover a lower member including the color filter layer CFL. The overcoat layer OC may protect the above-described lower member from a foreign matter such as dust. For convenience, a case where the overcoat layer OC is not included in each pixel PXL but is a separate component has been described in the above-described embodiment. However, the disclosure is not limited thereto. The overcoat layer OC may be a partial component included in each pixel PXL.

Figure 5:
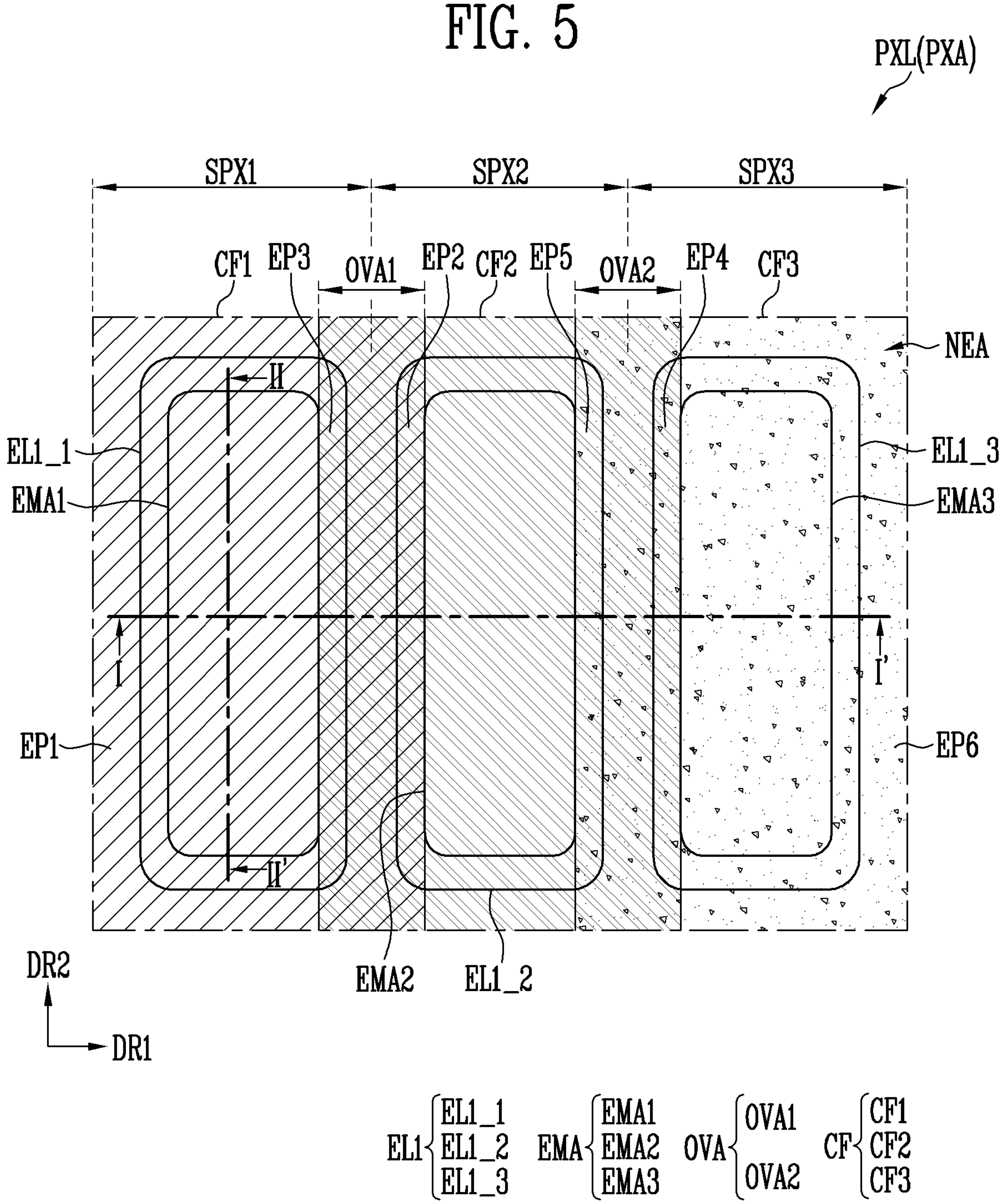
FIG. 5 is a schematic plan view illustrating a pixel in accordance with an embodiment.

FIG. 5 is a schematic plan view illustrating a pixel PXL in accordance with an embodiment.

In FIG. 5, the pixel PXL may include not only components included in the pixel PXL but also an area in which the components are provided (or located).

Referring to FIGS. 1 to 5, the pixel PXL may be located in a pixel area PXA provided in the display area DA. The pixel area PXA may include an emission area EMA and a non-emission area NEA.

The pixel PXL may include a first sub-pixel SPX1 (or first pixel), a second sub-pixel SPX2 (or second pixel), and a third sub-pixel SPX3 (or third pixel).

The first sub-pixel SPX1 may include a first emission area EMA1 and the non-emission area NEA adjacent to the first emission area EMA1 (or surrounding at least one side or a side of the first emission area EMA1). The second sub-pixel SPX2 may include a second emission area EMA2 and the non-emission area NEA adjacent to the second emission area EMA2 (or surrounding at least one side or a side of the second emission area EMA2). The third sub-pixel SPX3 may include a third emission area EMA3 and the non-emission area NEA adjacent to the third emission area EMA3 (or surrounding at least one side or a side of the third emission area EMA3). The first emission area EMA1, the second emission area EMA2, and the third emission area EMA3 may constitute the emission area EMA of the pixel PXL.

Each of the first, second, and third sub-pixels SPX1, SPX2, and SPX3 may include a light emitting element (see "LD" shown in FIG. 4) emitting light and circuit elements for driving the light emitting element LD. The first emission area EMA1 may be an area in which light is emitted from a light emitting element LD driven by circuit elements of the first sub-pixel SPX1 (or an area in which light passing through a first color filter CF1 is emitted). The second emission area EMA2 may be an area in which light is emitted from a light emitting element LD driven by circuit elements of the second sub-pixel SPX2 (or an area in which light passing through a second color filter CF2 is emitted). The third emission area EMA3 may be an area in which light is emitted from a light emitting element LD driven by circuit elements of the third sub-pixel SPX3 (or an area in which light passing through a third color filter CF3 is emitted).

The light emitting element LD located in the first sub-pixel SPX1 may include a (1-1)th electrode EL1_1, an emission layer (see "EML" shown in FIG. 6) located on the (1-1)th electrode EL1_1, and a second electrode (see "EL2" shown in FIG. 6) located on the emission layer EML. The light emitting element LD located in the second sub-pixel SPX2 may include a (1-2)th electrode EL1_2, an emission layer EML located on the (1-2)th electrode EL1_2, and a second electrode EL2 located on the emission layer EML. The light emitting element LD located in the third sub-pixel SPX3 may include a (1-3)th electrode EL1_3, an emission layer EML located on the (1-3)th electrode EL1_3, and a second electrode EL3 located on the emission layer EML. The (1-1)th electrode EL1_1, the (1-2)th electrode EL1_2, and a (1-3)th electrode EL1_3 may constitute a first electrode EL1 of the pixel PXL.

In the first sub-pixel SPX1, the first color filter CF1 may be disposed above the (1-1)th electrode EL1_1. In the second sub-pixel SPX2, the second color filter CF2 may be disposed above the (1-2)th electrode EL1_2. In the third sub-pixel SPX3, the third color filter CF3 may be disposed above the (1-3)th electrode EL1_3. For example, in case that the first sub-pixel SPX1 is a red sub-pixel emitting red light, the first color filter CF1 may include a red color filter. In case that the second sub-pixel SPX2 is a green sub-pixel emitting green light, the second color filter CF2 may include a green color filter. In case that the third sub-pixel SPX3 is a blue sub-pixel emitting blue light, the third color filter CF3 may include a blue color filter.

An overlapping area OVA in which color filters CF overlap each other may be located in the non-emission area NEA commonly provided in adjacent sub-pixels among the first, second, and third sub-pixels SPX1, SPX2, and SPX3. For example, a first overlapping area OVA1 in which the first color filter CF1 and the second color filter CF2 overlap each other may be located in the non-emission area NEA commonly provided between the first sub-pixel SPX1 and the second sub-pixel SPX2. A second overlapping area OVA2 in which the second color filter CF2 and the third color filter CF3 overlap each other may be located in the non-emission area NEA commonly provided between the second sub-pixel SPX2 and the third sub-pixel SPX3.

Color filters CF located in each of the first and second overlapping areas OVA1 and OVA2 may be disposed while overlapping each other, to be used as a light blocking member for blocking light interference between adjacent sub-pixels. Also, the color filters CF may correspond to a structure which finally defines each of the first, second, and third emission areas EMA1, EMA2, and EMA3.

In an embodiment, each of the first, second, and third color filters CF1, CF2, and CF3 may include first and second end portions located in the non-emission area NEA. For example, the first color filter CF1 may include a first end portion EP1 and a second end portion EP2, which face each other in the first direction DR1, the second color filter CF2 may include a first end portion EP3 and a second end portion EP4, which face each other in the first direction DR1, and the third color filter CF3 may include a first end portion EP5 and a second end portion EP6, which face each other in the first direction DR1. The second end portion EP2 of the first color filter CF1 and the first end portion EP3 of the second color filter CF2 are disposed in the non-emission area NEA (or the first overlapping area OVA1) commonly provided in the first sub-pixel SPX1 and the second sub-pixel SPX2 while overlap each other, to be used as a light blocking member for blocking light interference between the first and second sub-pixels SPX1 and SPX2. The second end portion EP4 of the second color filter CF2 and the first end portion EP5 of the third color filter CF3 are disposed in the non-emission area NEA (or the second overlapping area OVA2) commonly provided in the second sub-pixel SPX2 and the third sub-pixel SPX3 while overlapping each other, be used as a light blocking member for blocking light interference between the second and third sub-pixels SPX2 and SPX3.

Hereinafter, a stacked structure (or sectional structure) of the pixel PXL in accordance with the above-described embodiment will be described in detail with reference to FIGS. 6 to 9.

Figure 6:
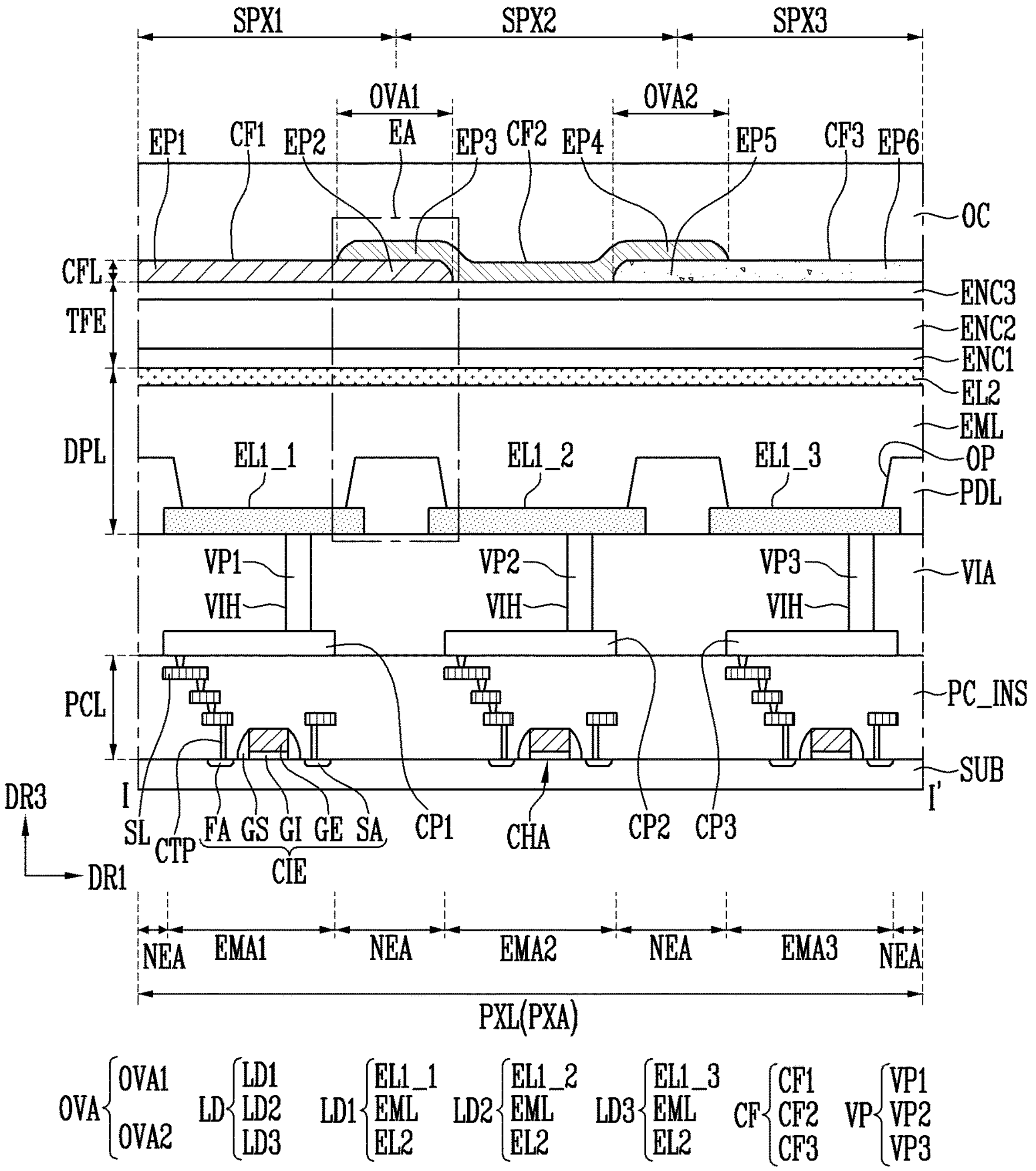
FIGS. 6 and 7 are schematic cross-schematic sectional views taken along line I-I' shown in FIG. 5.
Figure 7:
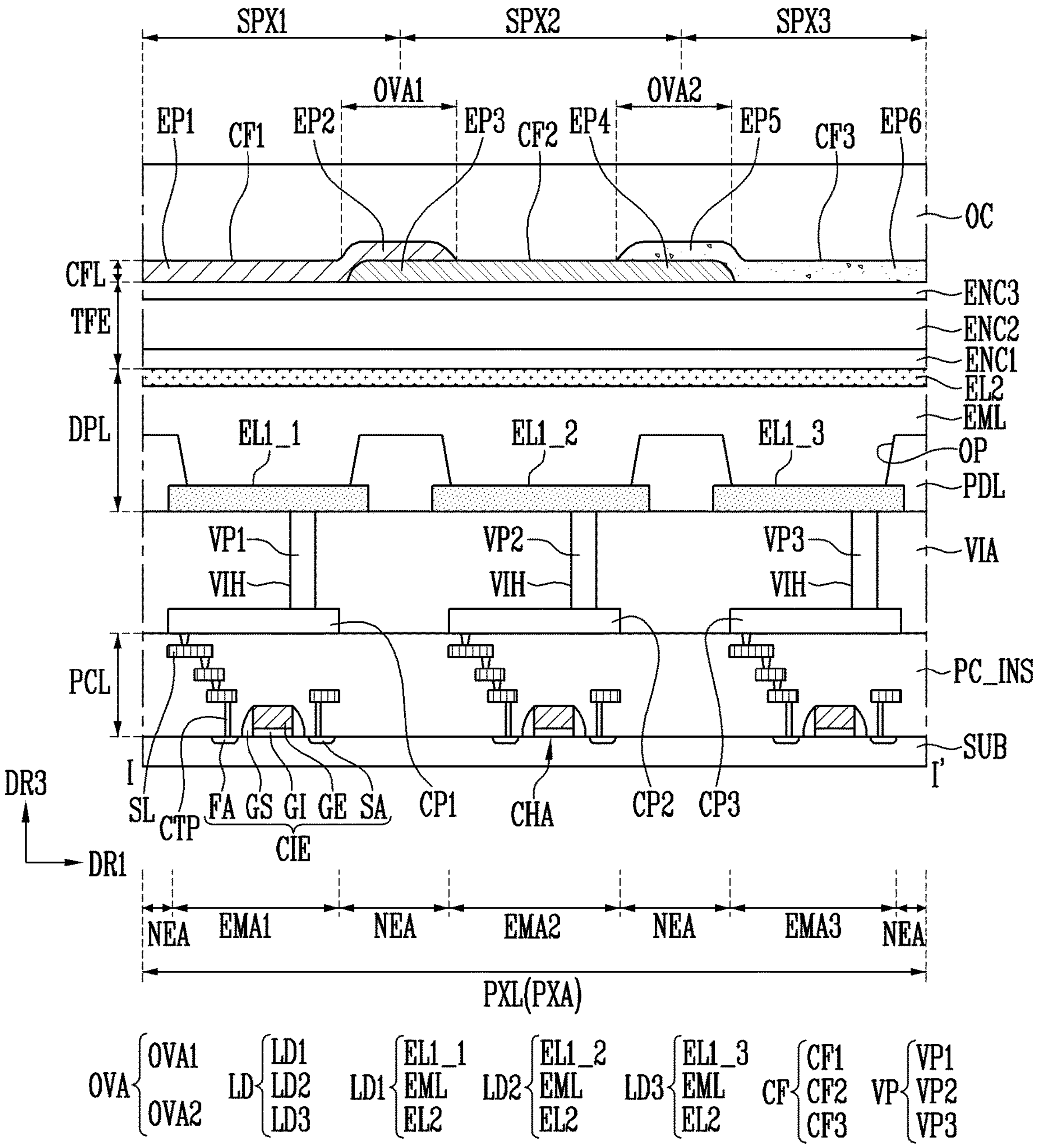
Figure 8:
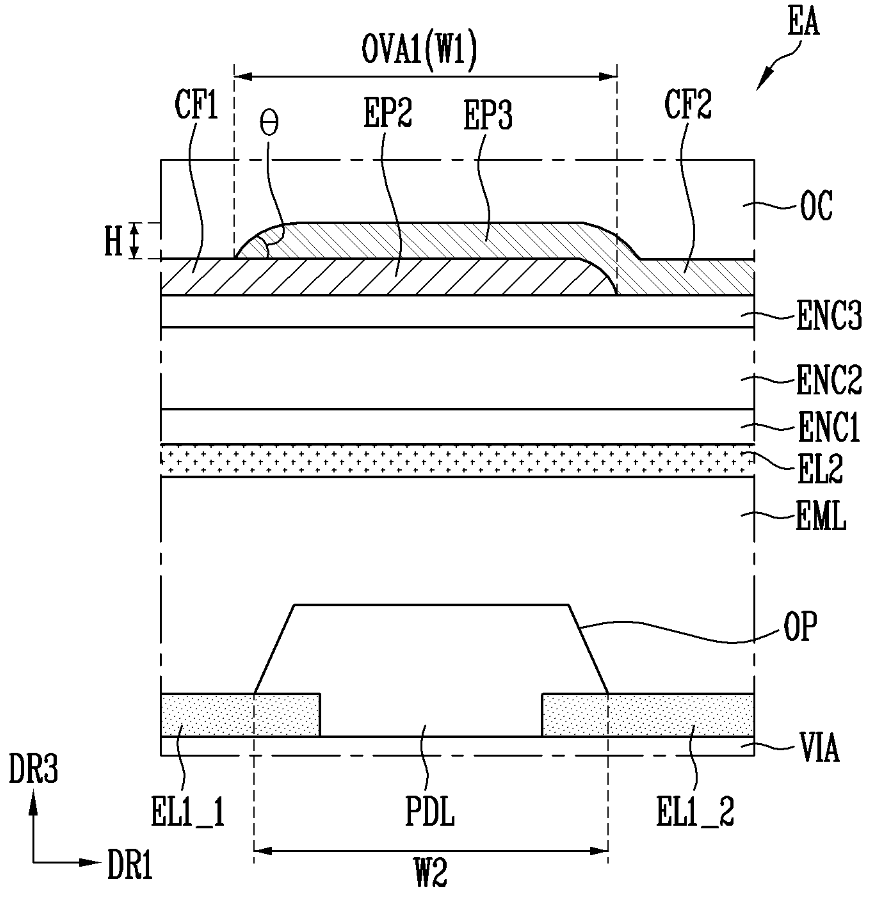
FIG. 8 is a schematic enlarged view illustrating portion EA shown in FIG. 6.
Figure 9:
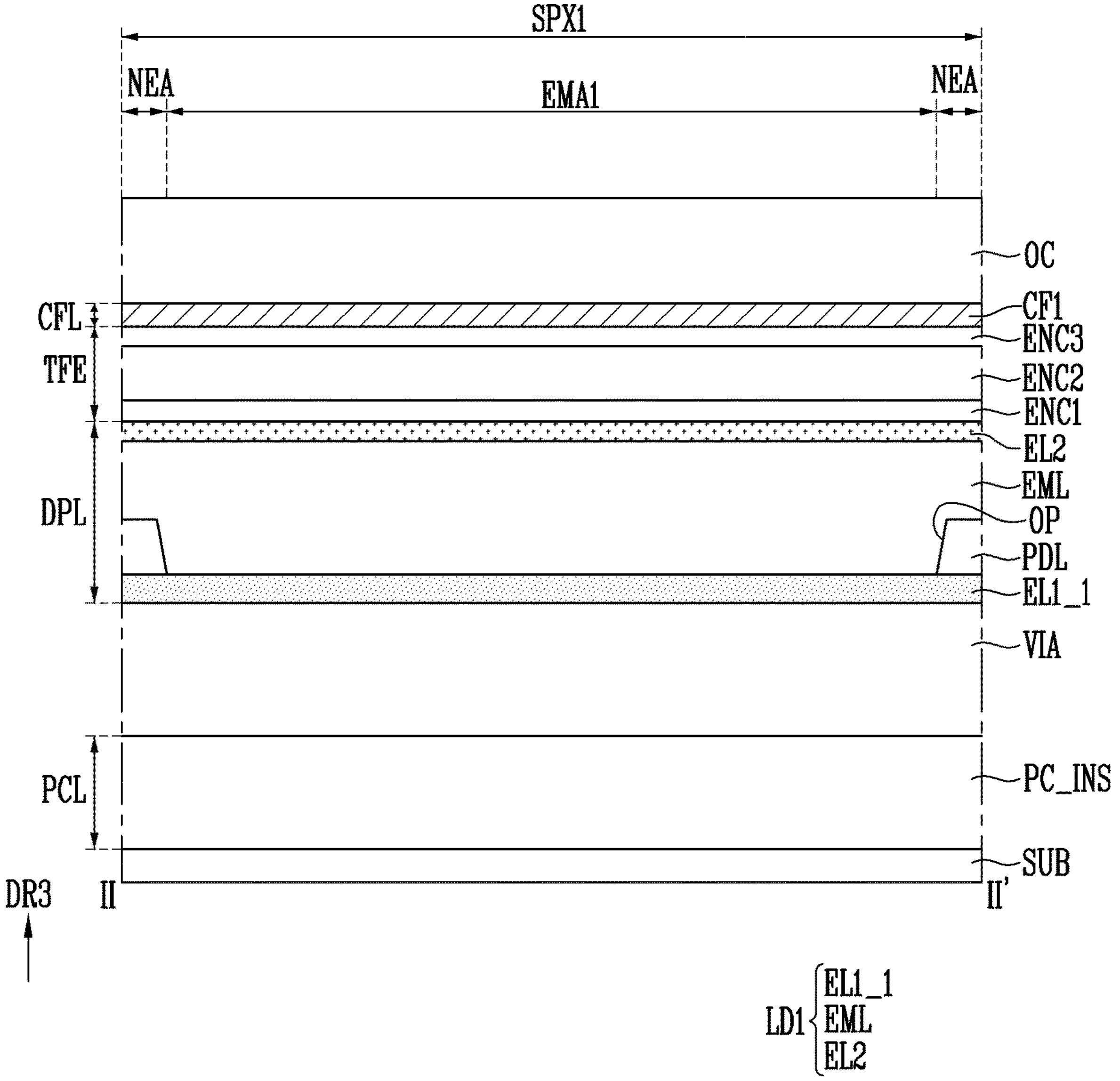
FIG. 9 are a schematic cross-sectional view taken along line II-II' shown in FIG. 5.

FIGS. 6 and 7 are schematic cross-sectional views taken along line I-I' shown in FIG. 5. FIG. 8 is a schematic enlarged view illustrating portion EA shown in FIG. 6. FIG. 9 are a schematic cross-sectional view taken along line II-II' shown in FIG. 5.

An embodiment shown in FIG. 7 illustrates a modified example of FIG. 6 in relation to a formation order of first, second, and third color filters CF1, CF2, and CF3, and the like within the spirit and the scope of the disclosure.

In embodiments shown in FIGS. 6 to 9, the stacked structure (or sectional structure) of the pixel PXL is simplified and illustrated, such as that each electrode is illustrated as an electrode having a signal layer and each insulating layer is illustrated as an insulating layer provided as a single layer, but the disclosure is not limited thereto.

In relation to embodiments shown in FIGS. 6 to 9, portions different from those of the above-described embodiment will be described to avoid redundancy.

Referring to FIGS. 1 to 9, the pixel PXL in accordance with an embodiment may include a first sub-pixel SPX1, a second sub-pixel SPX2, and a third sub-pixel SPX3.

Each of the first, second, and third sub-pixels SPX1, SPX2, and SPX3 may include a substrate SUB, a pixel circuit layer PCL, a via layer VIA, a display element layer DPL, a thin film encapsulation layer TFE, a color filter layer CFL, and an overcoat layer OC.

The substrate SUB may include a silicon wafer substrate formed using a semiconductor process. The substrate SUB may include a semiconductor material, for example, a Group IV semiconductor, a Group III-V compound semiconductor, or a Group II-VI compound semiconductor. For example, the Group IV semiconductor may include silicon, germanium, or silicon-germanium. The substrate SUB may be provided as a bulk wafer, an epitaxial layer, a Silicon On Insulator (SOI) layer, a Semiconductor On Insulator (SeOI) layer, or the like within the spirit and the scope of the disclosure.

The pixel circuit layer PCL may be disposed on the substrate SUB. The pixel circuit layer PCL may include circuit elements CIE, a circuit insulating layer PC_INS, contact plugs CTP, and circuit lines SL.

The circuit element CIE may include a transistor (for example, a driving transistor). The circuit element CIE may include a gate insulating layer GI, a gate electrode GE, and a gate spacer GS. First and second regions FA and SA may be disposed at both sides of the gate electrode GE in the substrate SUB. One of the first and second regions FA and SA may be a source region, and the other of the first and second regions FA and SA may be a drain region.

The gate insulating layer GI may be disposed on the substrate SUB. The gate insulating layer GI may include oxide, nitride, or a high dielectric constant (high-k) material. The high dielectric constant material may mean a dielectric material having a dielectric constant higher than a dielectric constant of silicon oxide ($SiO_x$). For example, the high dielectric constant material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), but the disclosure is not limited thereto.

The gate electrode GE may be disposed on the gate insulating layer GI. The gate electrode GE may include a conductive material. The conductive material may include, for example, a metal nitride such as titanium nitride (TiN), tantalum nitride (TaN), or tungsten nitride (WN), and/or a metal material such as aluminum (Al), tungsten (W), copper (Cu) or molybdenum (Mo), or a semiconductor material such as doped poly-silicon. The gate electrode GE may be a single layer or a multi-layer including at least two layers.

The gate spacer GS may be disposed at both sides of the gate electrode GE, and insulate the first and second regions FA and SA and the gate electrode GE from each other. In an embodiment, the gate spacer GS may be provided in a multi-layer structure. The gate space GS may be made of oxide, nitride, and oxynitride. For example, the gate spacer GS may be formed of a low dielectric constant layer.

The first and second regions FA and SA may be disposed at both sides of the gate electrode GE in the substrate SUB. The first and second regions FA and SA may correspond to a semiconductor layer including silicon (Si), and include different kinds and/or different concentrations of impurities.

A channel region CHA may be disposed under or below the gate electrode GE in the substrate SUB. The channel region CHA may be connected to the first and second regions FA and SA. The channel region CHA may be made of a semiconductor material, and include, for example, at least one of silicon (Si), silicon germanium (SiGe), and germanium (Ge).

The contact plugs CTP may be in contact with the first and second regions FA and SA while recessing the first and second regions FA and SA, and be disposed to be in contact with along tops of the first and second regions FA and SA. However, the disclosure is not limited thereto. The contact plugs CTP may include, for example, a metal nitride such as titanium nitride (TiN), tantalum nitride (TaN), or tungsten nitride (WN), and/or a metal material such as aluminum (Al), tungsten (W), copper (Cu) or molybdenum (Mo), but the disclosure is not limited thereto.

The circuit insulating layer PC_INS may be disposed over the circuit elements CIE on the substrate SUB. The contact plugs CTP may be electrically connected to the first and second regions FA and SA while penetrating the circuit insulating layer PC_INS. Although not directly shown in the drawings, the gate electrode GE and the contact plug CTP may be electrically connected to each other. The circuit lines SL may be electrically connected to the contact plugs CTP, and be disposed in layers.

The pixel circuit layer PCL may further include scan lines and data lines disposed to intersect the scan lines. The scan lines may be supplied with a scan signal through a scan driver (see "SDV" shown in FIG. 2), and the data lines may be supplied with data voltages through a data driver (see "DDV" shown in FIG. 2).

The transistor which the circuit element CIE constitutes may be electrically connected to a first electrode of a corresponding sub-pixel. For example, a transistor which a circuit element CIE constitutes in the first sub-pixel SPX1 may be electrically connected to a (1-1)th electrode EL1_1, a transistor which a circuit element CIE constitutes in the second sub-pixel SPX2 may be electrically connected to a (1-2)th electrode EL1_2, and a transistor which a circuit element CIE constitutes in the third sub-pixel SPX3 may be electrically connected to a (1-3)th electrode EL1_3.

First, second, and third conductive patterns CP1, CP2, and CP3 may be disposed on the pixel circuit layer PCL to be spaced apart from each other. The first, second, and third conductive patterns CP1, CP2, and CP3 may be disposed on a same plane, and have a same thickness in a third direction DR3. The first, second, and third conductive patterns CP1, CP2, and CP3 may be simultaneously formed through a same process.

The first conductive pattern CP1 may be disposed on the circuit insulating layer PC_INS in the first sub-pixel SPX1, and be electrically connected to a transistor. For example, the first conductive pattern CP1 may be electrically connected to a circuit element CIE constituting the transistor through a corresponding circuit line SL.

The second conductive pattern CP2 may be disposed on the circuit insulating layer PC_INS in the second sub-pixel SPX2, and be electrically connected to a transistor. For example, the second conductive pattern CP2 may be electrically connected to a circuit element CIE constituting the transistor through a corresponding circuit line SL.

The third conductive pattern CP3 may be disposed on the circuit insulating layer PC_INS in the third sub-pixel SPX3, and be electrically connected to a transistor. For example, the third conductive pattern CP3 may be electrically connected to a circuit element CIE constituting the transistor through a corresponding circuit line SL.

The first, second, and third conductive patterns CP1, CP2, and CP3 may be used as a reflective member for reflecting light emitted from an emission layer EML to advance toward the pixel circuit layer PCL in an upper direction (for example, the third direction DR3). The first, second, and third conductive patterns CP1, CP2, and CP3 may include a metal material having high reflexibility. For example, the first, second, and third conductive patterns CP1, CP2, and CP3 may include a material such as aluminum (Al) or silver (Ag), but the disclosure is not limited thereto.

In an embodiment, a buffer metal layer may be disposed on each of the first, second, and third conductive patterns CP1, CP2, and CP3. The buffer metal layer may protect each of the first, second, and third conductive patterns CP1, CP2, and CP3, increase adhesion between metals, and decrease a contact resistance between metals.

The via layer VIA may be disposed over the first, second, and third conductive patterns CP1, CP2, and CP3. The via layer VIA may cover the first, second, and third conductive patterns CP1, CP2, and CP3, and cover the circuit insulating layer PC_INS between adjacent conductive patterns. In an embodiment, the via layer VIA may be used as a planarization layer for reducing a step difference caused by components disposed thereunder, but the disclosure is not limited thereto.

In an embodiment, the via layer VIA may have a micro cavity structure in which light emitted from the emission layer EML is reflected and re-reflected between metal patterns disposed to be vertically spaced apart from each other. The via layer VIA may include a material having high transmittance. For example, the via layer VIA may be an inorganic insulating layer including an inorganic material or an organic insulating layer including an organic material. The inorganic insulating layer may include at least one of silicon oxide ($SiO_x$), silicon nitride ($SiN_x$), silicon oxynitride ($SiO_xN_y$), and aluminum oxide ($AlO_x$). The via layer VIA may be partially opened to expose one area or an area of each of the first, second, and third conductive patterns CP1, CP2, and CP3. For example, the via layer VIA may be partially opened to include a via hole VIH exposing one area or an area of each of the first, second, and third conductive patterns CP1, CP2, and CP3.

A via plug VP may be disposed in the via hole VIH. The via plug VP may include first, second, and third via plugs VP1, VP2, and VP3. Each of the first, second, and third via plugs VP1, VP2, and VP3 may include a conductive material such as tungsten or copper, which is used in a semiconductor process, but the disclosure is not limited thereto.

The first via plug VP1 may be electrically connected to the first conductive pattern CP1 while penetrating the via layer VIA in the first sub-pixel SPX1. The first via plug VP1 may be electrically connected to the circuit element CIE through the circuit line SL in contact with the first conductive pattern CP1. Also, the first via plug VP1 may be electrically connected to the (1-1)th electrode EL1_1 of the display element layer DPL.

The second via plug VP2 may be electrically connected to the second conductive pattern CP2 while penetrating the via layer VIA in the second sub-pixel SPX2. The second via plug VP2 may be electrically connected to the circuit element CIE through the circuit line SL in contact with the second conductive pattern CP2. Also, the second via plug VP2 may be electrically connected to the (1-2)th electrode EL1_2 of the display element layer DPL.

The third via plug VP3 may be electrically connected to the third conductive pattern CP3 while penetrating the via layer VIA in the third sub-pixel SPX3. The third via plug VP3 may be electrically connected to the circuit element CIE through the circuit line SL in contact with the third conductive pattern CP3. Also, the third via plug VP3 may be electrically connected to the (1-3)th electrode EL1_3 of the display element layer DPL.

In an embodiment, the via layer VIA may be omitted. The display element layer DPL may be directly disposed on the pixel circuit layer PCL. Each of the (1-1)th, (1-2)th, and (1-3)th electrodes EL1_1, EL1_2, and EL1_3 may be directly connected to a corresponding circuit line SL while penetrating the circuit insulating layer PC_INS to be electrically connected to a corresponding circuit element CIE through the circuit line SL.

The display element layer DPL may be disposed on the via layer VIA. The display element layer DPL may include a light emitting element LD and a pixel defining layer PDL. The light emitting element LD may include a first light emitting element LD1 located in the first sub-pixel SPX1, a second light emitting element LD2 located in the second sub-pixel SPX2, and a third light emitting element LD3 located in the third sub-pixel SPX3.

The first light emitting element LD1 may include the (1-1)th electrode EL1_1 the emission layer EML, and a second electrode EL2. The second light emitting element LD2 may include the (1-2)th electrode EL1_2, the emission layer EML, and the second electrode EL2. The third light emitting element LD3 may include the (1-3)th electrode EL1_3, the emission layer EML, and the second electrode EL2.

Each of the (1-1)th electrode EL1_1, the (1-2)th electrode EL1_2, and the (1-3)th electrode EL1_3 may be provided and/or formed on the via layer VIA of a corresponding sub-pixel. The (1-1)th electrode EL1_1, the (1-2)th electrode EL1_2, and the (1-3)th electrode EL1_3 may be disposed on the via layer VIA to be spaced apart from each other. The (1-1)th electrode EL1_1 may be an anode of the first light emitting element LD1, the (1-2)th electrode EL1_2 may be an anode of the second light emitting element LD2, and the (1-3)th electrode EL1_3 may be an anode of the third light emitting element LD3.

The (1-1)th, (1-2)th, and (1-3)th electrodes EL1_1, EL1_2, and EL1_3 may include a transparent conductive material capable of allowing light to be transmitted therethrough. For example, the transparent conductive material may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene (PEDOT), and the like, but the disclosure is not limited thereto. In an embodiment, the (1-1)th, (1-2)th, and (1-3)th electrodes EL1_1, EL1_2, and EL1_3 may include an opaque conductive material capable of reflecting light in the upper direction.

The pixel defining layer PDL may be disposed on the (1-1)th electrode EL1_1, the (1-2)th electrode EL1_2, the (1-3)th electrode EL1_3, and the via layer VIA.

The pixel defining layer PDL may be partially opened to include an opening which is located in the non-emission area NEA and exposes one area or an area of the (1-1)th electrode EL1_1 in at least the first emission area EMA1, another opening OP which is located in the non-emission area NEA and exposes one area or an area of the (1-2)th electrode EL1_2 in at least the second emission area EMA2, and still another opening OP which is located in the non-emission area NEA and exposes one area or an area of the (1-3)th electrode EL1_3 in at least the third emission area EMA3.

The pixel defining layer PDL may be an organic insulating layer including an organic material. The organic material may include acrylic resin, epoxy resin, phenolic resin, polyamide resin, polyimide resin, and the like within the spirit and the scope of the disclosure. In an embodiment, the pixel defining layer PDL may include a light absorption material or have a light absorber coated thereon, to absorb light introduced from the outside. For example, the pixel defining layer PDL may include a carbon-based black pigment. However, the disclosure is not limited thereto.

The pixel defining layer PDL may protrude in the third direction DR3 from a surface (or top surface) of the via layer VIA.

The emission layer EML may be disposed on the (1-1)th electrode EL1_1 exposed by the opening OP of the pixel defining layer PDL, the (1-2)th electrode EL1_2 exposed by the another opening OP of the pixel defining layer PDL, and the (1-3)th electrode EL1_3 exposed by the still another opening OP of the pixel defining layer PDL.

The emission layer EML may be disposed on the (1-1)th, (1-2)th, and (1-3)th electrodes EL1_1, EL1_2, and EL1_3 exposed by the openings OP of the pixel defining layer PDL. Also, the emission layer EML may be disposed on a side and a top of the pixel defining layer PDL. The emission layer EML may be a common layer commonly provided in the first, second, and third sub-pixels SPX1, SPX2, and SPX3.

The emission layer EML may have a multi-layer thin film structure including a light generation layer for generating light. For example, the emission layer EML may include a hole injection layer for injecting holes, a hole transport layer for increasing a hole recombination opportunity by suppressing movement of electrons which are excellent in transportability of holes and are not combined in a light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons. However, the disclosure is not limited thereto.

In an embodiment, the emission layer EML may emit white-based light.

The second electrode EL2 may be disposed on the emission layer EML. The second electrode EL2 may be a common layer commonly provided in the first, second, and third sub-pixels SPX1, SPX2, and SPX3. The second electrode EL2 may be provided in a plate shape throughout the whole of the display area DA.

The second electrode EL2 may be a thin metal layer having a thickness to a degree to which light emitted from the emission layer EML of each of the first, second, and third sub-pixels SPX1, SPX2, and SPX3 can be transmitted therethrough. The second electrode EL2 may be formed of a metal material to have a relatively thin thickness or be formed of a transparent conductive material. For example, the second electrode EL2 may be configured with various transparent conductive materials. The second electrode EL2 may include at least one of various transparent conductive materials including indium tin oxide, indium zinc oxide, indium tin zinc oxide, aluminum zinc oxide, gallium zinc oxide, zinc tin oxide, and gallium tin oxide, and be formed substantially transparent or translucent to satisfy a selectable transmittance. Accordingly, light emitted from the emission layer EML located on the bottom of the second electrode EL2 may be emitted upwardly from the thin film encapsulating layer TFE while passing through the second electrode EL2.

The thin film encapsulation layer TFE may be entirely provided and/or formed over the second electrode EL2.

The thin film encapsulation layer TFE may include first, second, and third encapsulation layers ENC1, ENC2, and ENC3 sequentially located on the second electrode EL2. The first encapsulation layer ENC1 may be located on the display element layer DPL (or the second electrode EL2), thereby being located throughout the display area DA and at least a portion of the non-display area NDA. The second encapsulation layer ENC2 may be located on the first encapsulation layer ENC1, thereby being located throughout the display area DA and at least a portion of the non-display area NDA. The third encapsulation layer ENC3 may be located on the second encapsulation layer ENC2, thereby being located throughout the display area DA and at least a portion of the non-display area NDA. In an embodiment, the third encapsulation layer ENC3 may be located throughout the whole of the display area DA and the non-display area NDA.

Each of the first and third encapsulation layers ENC1 and ENC3 may be an inorganic layer including an inorganic material, and the second encapsulation layer ENC2 may be an organic layer including an organic material. The inorganic layer may include, for example, silicon nitride ($SiN_x$), silicon oxide ($SiO_x$), silicon oxynitride ($SiO_xN_y$), or the like within the spirit and the scope of the disclosure. The organic layer may include an organic insulating material such as acrylic resin, epoxy resin, phenolic resin, polyamides resin, polyimides resin, polyester resin, poly-phenylene sulfide resin, or benzocyclobutene (BCB).

The color filter layer CFL may be disposed on the thin film encapsulation layer TFE. The color filter layer CFL may include color filters CF. In an example, the color filter layer CFL may include first, second, and third color filters CF1, CF2, and CF3.

The first color filter CF1 may be disposed in the first sub-pixel SPX1, the second color filter CF2 may be disposed in the second sub-pixel SPX2, and the third color filter CF3 may be disposed in the third sub-pixel SPX3. The first color filter CF1 may be disposed on the thin film encapsulation layer TFE to correspond to the (1-1)th electrode EL1_1 in at least the first emission area EMA1. The second color filter CF2 may be disposed on the thin film encapsulation layer TFE to correspond to the (1-2)th electrode EL1_2 in at least the second emission area EMA2. The third color filter CF3 may be disposed on the thin film encapsulation layer TFE to correspond to the (1-3)th electrode EL1_3 in at least the third emission area EMA3.

Adjacent color filters CF among the first, second, and third color filters CF1, CF2, and CF3 may be disposed in the non-emission area NEA while overlapping each other, to be used as a light blocking member for blocking light interference between adjacent sub-pixels. For example, the first color filter CF1 and the second color filter CF2 may be disposed in the non-emission area NEA commonly provided in the first sub-pixel SPX1 and the second sub-pixel SPX2 to overlap each other. The second color filter CF2 and the third color filter CF3 may be disposed in the non-emission area NEA commonly provided in the second sub-pixel SPX2 and the third sub-pixel SPX3 to overlap each other.

Each of the first, second, and third color filters CF1, CF2, and CF3 may include a colorant, such as a dye or a pigment, which absorbs wavelengths except a corresponding color wavelength. For example, one of the first, second, and third color filters CF1, CF2, and CF3 may be a red color filter which allows red light to be transmitted therethrough and absorbs light of a wavelength range except the red light, another of the first, second, and third color filters CF1, CF2, and CF3 may be a green color filter which allows green light to be transmitted therethrough and absorbs light of a wavelength range except the green light, and the other of the first, second, and third color filters CF1, CF2, and CF3 may be a blue color filter which allows blue light to be transmitted therethrough and absorbs light of a wavelength range except the blue light. For example, the first color filter CF1 may be a red color filter, the second color filter CF2 may be a green color filter, and the third color filter CF3 may be a blue color filter. However, the disclosure is not limited thereto.

In an embodiment, at least one of the first, second, and third color filters CF1, CF2, and CF3 may include a monomer containing fluorine, thereby having a refractive index smaller than a refractive index of the overcoat layer OC located on the top thereof. For example, each of the first, second, and third color filters CF1, CF2, and CF3 may include a monomer containing fluorine, thereby having a refractive index smaller than the refractive index of the overcoat layer OC. The monomer may include, for example, an epoxy-based monomer and a (meta) acrylic-based monomer.

In an embodiment, each of the first, second, and third color filters CF1, CF2, and CF3 may include resin and hollow particles dispersed inside the resin, thereby having a refractive index smaller than the refractive index of the overcoat layer OC located on the top thereof. The hollow particles may be hollow silica particles. The hollow silica particles are silica particles derived from a silicon compound or an organic silicon compound, and may mean particles in a form in which an empty space exists on the surface of and/or inside the silica particles.

Each of the above-described first, second, and third color filters CF1, CF2, and CF3 may have a refractive index of 1.40 to 1.55, but the disclosure is not limited thereto.

The overcoat layer OC may be disposed over the above-described color filter layer CFL.

The overcoat layer OC may be disposed over the color filter layer CFL to cover a lower member including the color filter layer CFL. The overcoat layer OC may prevent moisture or oxygen from being introduced into the color filter layer CFL. The overcoat layer OC may be an organic insulating layer including an organic material. For example, the overcoat layer OC may include at least one of acrylic resin, epoxy resin, phenolic resin, polyamides resin, polyimides resin, polyester resin, poly-phenylene sulfide resin, or benzocyclobutene resin.

In an embodiment, the overcoat layer OC may have a refractive index greater than a refractive index of the color filter layer CFL. For example, the overcoat layer OC may have a refractive index of 1.55 to 1.7, but the disclosure is not limited thereto.

The first color filter CF1 and the second color filter CF2 may overlap each other in a non-emission area NEA which is located between the first sub-pixel SPX1 and the second sub-pixel SPX2 and is commonly provided in the first and second sub-pixels SPX1 and SPX2. The non-emission area NEA may include a first overlapping area OVA1 in which the first color filter CF1 and the second color filter CF2 overlap each other. A second end portion EP2 of the first color filter CF1 and a first end portion EP3 of the second color filter CF2 may overlap each other in the first overlapping area OVA1.

The second color filter CF2 and the third color filter CF3 may overlap each other in a non-emission area NEA which is located between the second sub-pixel SPX2 and the third sub-pixel SPX3 and is commonly provided in the second and third sub-pixels SPX2 and SPX3. The non-emission area NEA may include a second overlapping area OVA2 in which the second color filter CF2 and the third color filter CF3 overlap each other. A second end portion EP4 of the second color filter CF2 and a first end portion EP5 of the third color filter CF3 may overlap each other in the second overlapping area OVA2.

The first, second, and third color filters CF1, CF2, and CF3 may be formed through different processes. For example, the second color filter CF2 may be formed after each of the first and third color filters CF1 and CF3 is formed. The first end portion EP3 of the second color filter CF2 may be located on the second end portion EP2 of the first color filter CF1 in the first overlapping area OVA1 of the non-emission area NEA, and the second end portion EP4 of the second color filter CF2 may be located on the first end portion EP5 of the third color filter CF3 in the second overlapping area OVA2 of the non-emission area NEA. However, the disclosure is not limited thereto. In an embodiment, as shown in FIG. 7, after the second color filter CF2 is formed, each of the first and third color filters CF1 and CF3 may be formed. The second end portion EP2 of the first color filter CF1 may be located on the first end portion EP3 of the second color filter CF2 in the first overlapping area OVA1 of the non-emission area NEA, and the first end portion EP5 of the third color filter CF3 may be located on the second end portion EP4 of the second color filter CF2 in the second overlapping area OVA2 of the non-emission area NEA.

A width W1 of each of the first and second overlapping areas OVA1 and OVA2 may be set with respect to a width W2 of the pixel defining layer PDL. In an embodiment, the width W1 of each of the first and second overlapping areas OVA1 and OVA2 may be equal to or greater than a value obtained by subtracting about 0.6 μm from the width W2 of the pixel defining layer PDL and be equal to or smaller than a value obtained by adding about 0.2 μm to the width W2 of the pixel defining layer PDL.

A height H of a color filter CF located at an upper side in each of the first and second overlapping areas OVA1 and OVA2 (or located adjacent to the overcoat layer OC) may be measured as a highest point along the third direction DR3 from a surface (or top surface) of a color filter CF located on the bottom of the color filter CF located at the upper side. For example, a height H of the first end portion EP3 of the second color filter CF2 in the first overlapping area OVA1 may be measured as a highest point along the third direction DR3 from a surface (or top surface) of the second end portion EP2 of the first color filter CF1, and a height H of the second end portion EP4 of the second color filter CF2 in the second overlapping area OVA2 may be measured as a highest point along the third direction DR3 from a surface (or top surface) of the first end portion EP5 of the third color filter CF3. The height H of each of the first and second end portions EP3 and EP4 of the second color filter CF2 may be about 1 μm or more. However, the disclosure is not limited thereto. In an embodiment, the height H of a color filter CF located at an upper side in a corresponding overlapping area OVA may be in a range of about 1 μm to about 2 μm.

Additionally, each of first and second end portions of a color filter CF located at an upper side in each of the first and second overlapping areas OVA1 and OVA2 may have a side inclined with respect to a surface of a color filter CF located on the bottom of the color filter CF located at the upper side. The slope angle θ (or taper angle) of the side may be set to a range of about 60 degrees to about 90 degrees. For example, the first end portion EP3 of the second color filter CF2 in the first overlapping area OVA1 may have one side or a side inclined with respect to the surface (or top surface) of the second end portion EP2 of the first color filter CF1, and the second end portion EP4 of the second color filter CF2 in the second overlapping area OVA2 may have the other side inclined with respect to the surface (or top surface) of the first end portion EP5 of the third color filter CF3. The slope angle θ (or taper angle) of each of the one side or a side and the other side or another side may be in a range of about 65 degrees to about 90 degrees.

In case that the width W1 of each of the first and second overlapping areas OVA1 and OVA2, the height H of a color filter CF located at an upper side in a corresponding overlapping area OVA, and the slope angle θ of each of sides of the color filter CF are set as described above, and a refractive index of the color filter is smaller than the refractive index of the overcoat layer located on the top of the color filter CF, the efficiency of total reflection occurring due to a refractive index difference at an interface between the color filter CF and the overcoat layer OC can be further improved.

Light passing through each of the first, second, and third color filters CF1, CF2, and CF3 may be mostly released to the front of a corresponding sub-pixel. A portion of the light passing through each of the first, second, and third color filters CF1, CF2, and CF3 may be incident onto the non-emission area NEA (or overlapping area OVA) of the corresponding sub-pixel. Light incident onto the non-emission area NEA is totally reflected at an interface between a color filter CF located at an upper side in each of the first and second overlapping areas OVA1 and OVA2 and the overcoat layer OC and concentrated toward the front of the corresponding sub-pixel, so that the front light emission efficiency of the sub-pixel can be improved.

As each of the first, second, and third color filters CF1, CF2, and CF3 may include a monomer containing fluorine or may include hollow particles dispersed in resin, thereby having a refractive index smaller than the refractive index of the overcoat layer OC immediately disposed at an upper side of the corresponding color filter, a separate low refractive pattern provided to extract side light of each sub-pixel toward the front through total reflection may be omitted. Accordingly, a process for forming the separate low refractive pattern is omitted, and thus the manufacturing efficiency of the pixel PXL (or the display device DD) can be improved.

Figure 10:
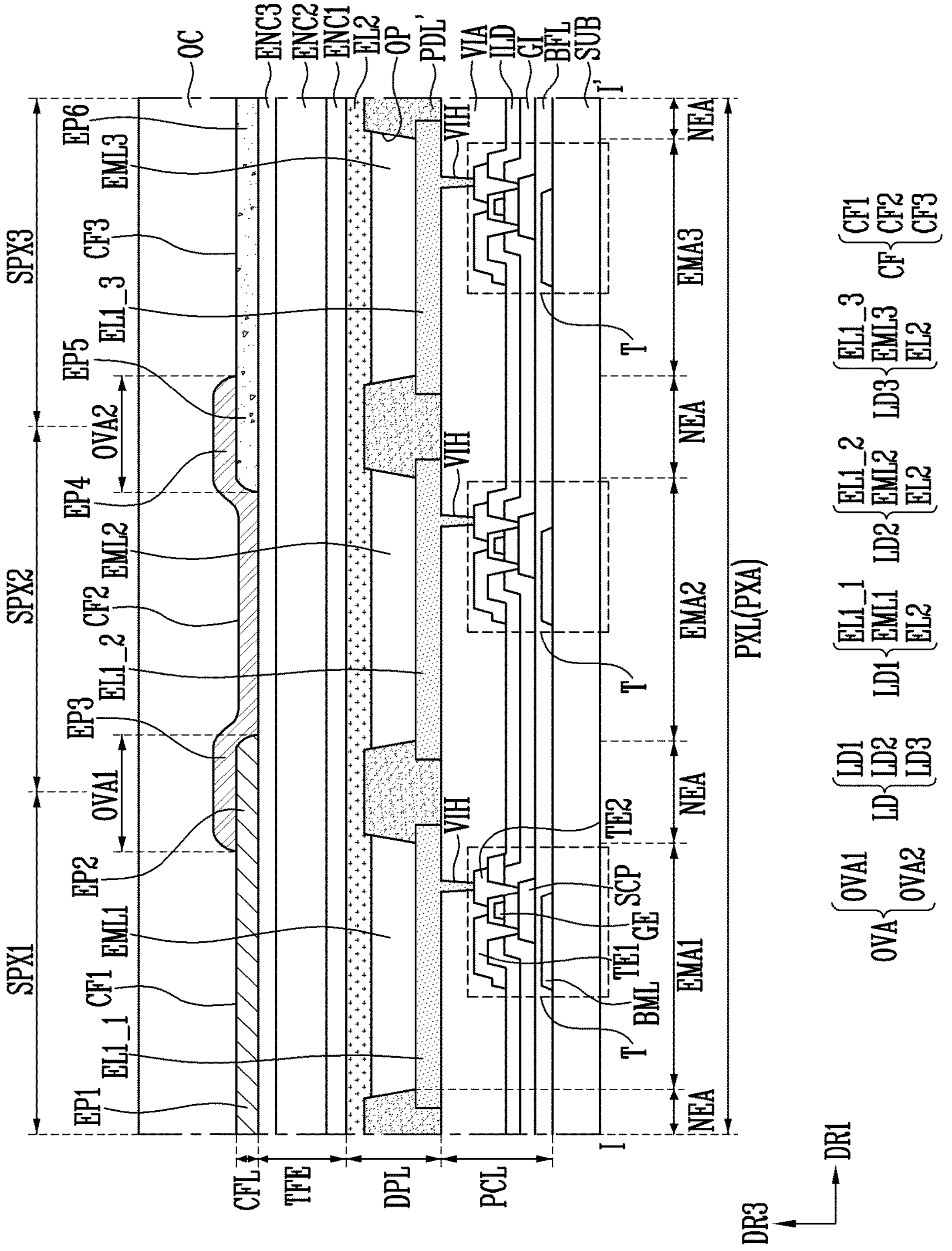
FIG. 10 illustrates a pixel in accordance with an embodiment, and is a schematic cross-sectional view corresponding to the line I-I' shown in FIG. 5.

FIG. 10 illustrates a pixel PXL in accordance with an embodiment, and is a schematic cross-sectional view corresponding to the line I-I' shown in FIG. 5.

Portions not particularly described in an embodiment shown in FIG. 10 follow those of the above-described embodiment. Identical reference numerals refer to identical components, and similar reference numerals refer to similar components.

In relation to an embodiment shown in FIG. 10, portions different from the portions of the above-described embodiment will be described to avoid redundancy.

Referring to FIGS. 1, 5, and 10, the pixel PXL in accordance with an embodiment may include first, second, and third sub-pixels SPX1, SPX2, and SPX3 arranged adjacent to each other. Each of the first, second, and third sub-pixels SPX1, SPX2, and SPX3 may include a substrate SUB, a pixel circuit layer PCL, a display element layer DPL, a thin film encapsulation layer TFE, a color filter layer CFL, and an overcoat layer OC.

The substrate SUB may include a transparent insulating material to allow light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Circuit elements (for example, a transistor T) and selectable signal lines electrically connected to the circuit elements may be disposed in each pixel area PXA of the pixel circuit layer PCL. A light emitting element LD electrically connected to circuit elements of each of the first, second, and third sub-pixels SPX1, SPX2, and SPX3 may be disposed in each pixel area PXA of the pixel circuit layer PCL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, and a via layer VIA, which may be sequentially stacked each other on the substrate SUB along the third direction DR3.

The buffer layer BFL may be entirely disposed on the substrate SUB. The buffer layer BFL may prevent an impurity from being diffused into the circuit elements. The buffer layer BFL may be an inorganic insulating layer including an inorganic material. The buffer layer BFL may include at least one of silicon nitride ($SiN_x$), silicon oxide ($SiO_x$), and silicon oxynitride ($SiO_xN_y$), or include at least one of metal oxides such as aluminum oxide ($AlO_x$). The buffer layer BFL may be provided as a single layer, but be provided as a multi-layer including at least two layers. In case that the buffer layer BFL is provided as the multi-layer, the layers may be formed of a same material or a similar material or be formed of different materials. The buffer layer BFL may be omitted according to a material of the substrate SUB, a process condition, and the like within the spirit and the scope of the disclosure.

The gate insulating layer GI may be entirely disposed on the buffer layer BFL. The gate insulating layer GI may include a same material or a similar material as the above-described buffer layer BFL, or include a material appropriate (or selected) from the materials disclosed as the material constituting the buffer layer BFL. For example, the gate insulating layer GI may be an inorganic insulting layer including an inorganic material.

The interlayer insulating layer ILD may be entirely provided and/or formed on the gate insulating layer GI. The interlayer insulating layer ILD may include a same material or a similar material as the buffer layer BFL, or include a material appropriate (or selected) from the materials disclosed as the material constituting the buffer layer BFL.

The via layer VIA may be entirely provided and/or formed on the interlayer insulating layer ILD. The via layer VIA may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin. In an embodiment, the via layer VIA may be an organic insulating layer including an organic material.

The via layer VIA may be partially opened to include a via hole VIH. The via hole VIH may be a connection point for electrically connecting a transistor T and a light emitting element LD of each of the first, second, and third sub-pixels SPX1, SPX2, and SPX3.

The circuit elements disposed in the pixel circuit layer PCL may include at least one transistor T. The transistor T may be a driving transistor for controlling a driving current of the light emitting element LD of each of the first, second, and third sub-pixels SPX1, SPX2, and SPX3.

The transistor T may include a semiconductor pattern SCP, a gate electrode GE, a first terminal TE1, and a second terminal TE2.

The gate electrode GE may be disposed on the gate insulating layer GI to be covered by the interlayer insulating layer ILD. In an example, the gate electrode GE may be a gate conductive layer located between the gate insulating layer GI and the interlayer insulating layer ILD. The gate electrode GE may overlap a portion of the semiconductor pattern SCP. In an example, the gate electrode GE may overlap an active pattern of the semiconductor pattern SCP.

The semiconductor pattern SCP may be provided and/or formed on the buffer layer BFL. In an example, the semiconductor pattern SCP may be located between the buffer layer BFL and the gate insulating layer GI. The semiconductor pattern SCP may be a semiconductor layer made of poly-silicon, amorphous silicon, an oxide semiconductor, or the like within the spirit and the scope of the disclosure. The semiconductor pattern SCP may include the active pattern, a first contact region, and a second contact region. The active pattern, the first contact region, and the second contact region may be a semiconductor layer undoped or doped with an impurity. In an example, the first contact region and the second contact region may be a semiconductor layer doped with the impurity, and the active pattern may be a semiconductor layer undoped with the impurity.

The active pattern of the semiconductor pattern SCP is a region overlapping the gate electrode GE of the transistor T, and may be a channel region. The first contact region of the semiconductor pattern SCP may be in contact with one end or an end of the active pattern. Also, the first contact region may be electrically connected to the first terminal TE1. The second contact region of the semiconductor pattern SCP may be in contact with the other end or another end of the active pattern. Also, the second contact region may be electrically connected to the second terminal TE2.

The first terminal TE1 may be provided and/or formed on the interlayer insulating layer ILD. For example, the first terminal TE1 may be a source-drain conductive layer formed between the interlayer insulating layer ILD and the via layer VIA. The first terminal TE1 may be in contact with the first contact region of the semiconductor pattern SCP through a contact hole penetrating the gate insulating layer GI and the interlayer insulating layer ILD.

The second terminal TE2 may be provided and/or formed on the interlayer insulating layer ILD, and be disposed to be spaced apart from the first terminal TE1. The second terminal TE2 may be a source-drain conductive layer formed between the interlayer insulating layer ILD and the via layer VIA. The second terminal TE2 may be in contact with the second contact region of the semiconductor pattern SCP through another contact hole penetrating the gate insulating layer GI and the interlayer insulating layer ILD.

A bottom metal pattern BML may be disposed under or below the above-described transistor T.

The bottom metal pattern BML may be a first conductive layer located between the substrate SUB and the buffer layer BFL. The bottom metal pattern BML may be electrically connected to the transistor T, to widen the driving range of a selectable voltage supplied to the gate electrode GE of the transistor T. Although not directly shown in the drawings, the bottom metal pattern BML is electrically connected to the transistor T, to stabilize the channel region of the transistor T. As the bottom metal pattern BML is electrically connected to the transistor T, floating of the bottom metal pattern BML can be prevented.

The via layer VIA may be disposed over the transistor T. The via layer VIA may expose one area or an area (for example, the second transistor TE2) of a transistor T of each of the first, second, and third sub-pixels SPX1, SPX2, and SPX3 through the via hole VIH. In the first sub-pixel SPX1, a transistor T exposed through a via hole VIH of the via layer VIA may be electrically connected to a (1-1)th electrode EL1_1. In the second sub-pixel SPX2, a transistor T exposed through a via hole of the via layer VIA may be electrically connected to a (1-2)th electrode EL1_2. In the third sub-pixel SPX3, a transistor T exposed through a via hole of the via layer VIA may be electrically connected to a (1-3)th electrode EL1_3.

The display element layer DPL may be located on the via layer VIA.

The display element layer DPL may include first, second, and third light emitting elements LD1, LD2, and LD3 and a pixel defining layer PDL'.

The first light emitting element LD1 may include the (1-1)th electrode EL1_1 a first emission layer EML1, and a second electrode EL2. The second light emitting element LD2 may include the (1-2)th electrode EL1_2, a second emission layer EML2, and the second electrode EL2. The third light emitting element LD3 may include the (1-3)th electrode EL1_3, a third emission layer EML3, and the second electrode EL2. Each of the first, second, and third light emitting elements LD1, LD2, and LD3 may be electrically connected to a transistor T of a corresponding sub-pixel.

Each of the (1-1)th electrode EL1_1, the (1-2)th electrode EL1_2, and the (1-3)th electrode EL1_3 may be provided and/or formed on the via layer VIA of a corresponding sub-pixel SPX. The (1-1)th electrode EL1_1, the (1-2)th electrode EL1_2, and the (1-3)th electrode EL1_3 may be disposed on the via layer VIA to be spaced apart from each other. The (1-1)th electrode EL1_1 may be an anode of the first light emitting element LD1, the (1-2)th electrode EL1_2 may be an anode of the second light emitting element LD2, and the (1-3)th electrode EL1_3 may be an anode of the third light emitting element LD3.

The pixel defining layer PDL' may be disposed on (1-1)th electrode EL1_1, the (1-2)th electrode EL1_2, the (1-3)th electrode EL1_3, and the via layer VIA.

The pixel defining layer PDL' may be located in a non-emission area NEA, and define a first emission area EMA1 of the first sub-pixel SPX1, a second emission area EMA2 of the second sub-pixel SPX2, and a third emission area EMA3 of the third sub-pixel SPX3. The pixel defining layer PDL' may include an opening OP exposing each of one area or an area of the (1-1)th electrode EL1_1, one area or an area of the (1-2)th electrode EL1_2, and one area or an area of the (1-3)th electrode EL1_3. The opening OP of the pixel defining layer PDL' may correspond to each of the first, second, and third emission areas EMA1, EMA2, and EMA3.

The pixel defining layer PDL' may be an organic insulating layer including an organic material. The organic material may include acrylic resin, epoxy resin, phenolic resin, polyamide resin, polyimide resin, and the like within the spirit and the scope of the disclosure.

The pixel defining layer PDL' may protrude in the third direction DR3 from the via layer VIA along a circumference of each of the first, second, and third emission areas EMA1, EMA2, and EMA3.

The first emission layer EML1 may be disposed on the (1-1)th electrode EL1_1 exposed by an opening OP of the pixel defining layer PDL', the second emission layer EML2 may be disposed on the (1-2)th electrode EL1_2 exposed by an opening OP of the pixel defining layer PDL', and the third emission layer EML3 may be disposed on the (1-3)th electrode EL1_3 exposed by an opening OP of the pixel defining layer PDL'.

The first emission layer EML1 may be located on only the (1-1)th electrode EL1_1 in an opening OP of the pixel defining layer PDL', the second emission layer EML2 may be located on only the (1-2)th electrode EL1_2 in another opening OP of the pixel defining layer PDL', and the third emission layer EML3 may be located on only the (1-3)th electrode EL1_3 in still another opening OP of the pixel defining layer PDL'. Each of the first emission layer EML1, the second emission layer EML2, and the third emission layer EML3 may be supplied to a desired area of a corresponding sub-pixel SPX (for example, on the top of one area or an area of a first electrode EL1 exposed by an opening OP of the pixel defining layer PDL') by using an inkjet printing method or the like, but the disclosure is not limited thereto.

Each of the first, second, and third emission layers EML1, EML2, and EML3 may have a multi-layer thin film structure including a light generation layer for generating light. In an embodiment, the first emission layer EML1 may generate and emit light of red, the second emission layer EML2 may generate and emit light of green, and the third emission layer EML3 may generate and emit light of blue. However, the disclosure is not limited thereto.

The second electrode EL2 may be disposed on the first emission layer EML1, the second emission layer EML2, the third emission layer EML3, and the pixel defining layer PDL'.

The second electrode EL2 may be a common layer commonly provided in the first, second, and third sub-pixels SPX1, SPX2, and SPX3. The second electrode EL2 may be provided in a plate shape throughout the whole of the display area DA.

The thin film encapsulation layer TFE may be entirely provided and/or formed over the second electrode EL2.

The color filter layer CFL may be provided and/or formed on the thin film encapsulation layer TFE.

The color filter layer CFL may include a first color filter CF1 corresponding to the first emission layer EML1, a second color filter CF2 corresponding to the second emission layer EML2, and a third color filter CF3 corresponding to the third emission layer EML3. The first color filter CF1 may be disposed in the first sub-pixel SPX1, the second color filter CF2 may be disposed in the second sub-pixel SPX2, and the third color filter CF3 may be disposed in the third sub-pixel SPX3. For example, the first color filter CF1 may be a red color filter, the second color filter CF2 may be a green color filter, and the third color filter CF3 may be a blue color filter. However, the disclosure is not limited thereto.

In an embodiment, at least one of the first, second, and third color filters CF1, CF2, and CF3 may include a monomer containing fluorine, thereby having a refractive index smaller than a refractive index of the overcoat layer OC located on the top thereof. For example, each of the first, second, and third color filters CF1, CF2, and CF3 may include a monomer containing fluorine, thereby having a refractive index smaller than the refractive index of the overcoat layer OC.

In an embodiment, each of the first, second, and third color filters CF1, CF2, and CF3 may include resin and hollow particles dispersed inside the resin, thereby having a refractive index smaller than the refractive index of the overcoat layer OC located on the top thereof. The hollow particles may be hollow silica particles.

The first color filter CF1 and the second color filter CF2 may overlap each other in a non-emission area NEA which is located between the first sub-pixel SPX1 and the second sub-pixel SPX2 and is commonly provided in the first and second sub-pixels SPX1 and SPX2. The non-emission area NEA may include a first overlapping area OVA1 in which the first color filter CF1 and the second color filter CF2 overlap each other. A second end portion EP2 of the first color filter CF1 and a first end portion EP3 of the second color filter CF2 may overlap each other in the first overlapping area OVA1. For example, the first end portion EP3 of the second color filter CF2 may be located on the second end portion EP2 of the first color filter CF1 in the first overlapping area OVAL.

The second color filter CF2 and the third color filter CF3 may overlap each other in a non-emission area NEA which is located between the second sub-pixel SPX2 and the third sub-pixel SPX3 and is commonly provided in the second and third sub-pixels SPX2 and SPX3. The non-emission area NEA may include a second overlapping area OVA2 in which the second color filter CF2 and the third color filter CF3 overlap each other. A second end portion EP4 of the second color filter CF2 and a first end portion EP5 of the third color filter CF3 may overlap each other in the second overlapping area OVA2. For example, the second end portion EP4 of the second color filter CF2 may be located on the first end portion EP5 of the third color filter CF3 in the second overlapping area OVA2.

The overcoat layer OC may be disposed over the above-described color filter layer CFL.

The overcoat layer OC may be disposed over the color filter layer CFL to cover a lower member including the color filter layer CFL. The overcoat layer OC may prevent moisture or oxygen from being introduced into the color filter layer CFL. The overcoat layer OC may be an organic insulating layer including an organic material.

For embodiment, the overcoat layer OC may have a refractive index greater than a refractive index of each of the first, second, and third color filters CF1, CF2, and CF3.

In each of the first and second overlapping layers OVA1 and OVA2, total reflection may occur due to a refractive difference at an interface between the overcoat layer OC and adjacent color filters which have a refractive index smaller than the refractive index of the overcoat layer OC and are disposed to overlap each other. Thus, while a portion of light advancing toward the non-emission area NEA (or the overlapping area OVA) in each of the first, second, and third sub-pixels SPX1, SPX2, and SPX3 is concentrated in a front direction of a corresponding sub-pixel, the front light emission efficiency of the sub-pixel can be improved.

Figure 11:
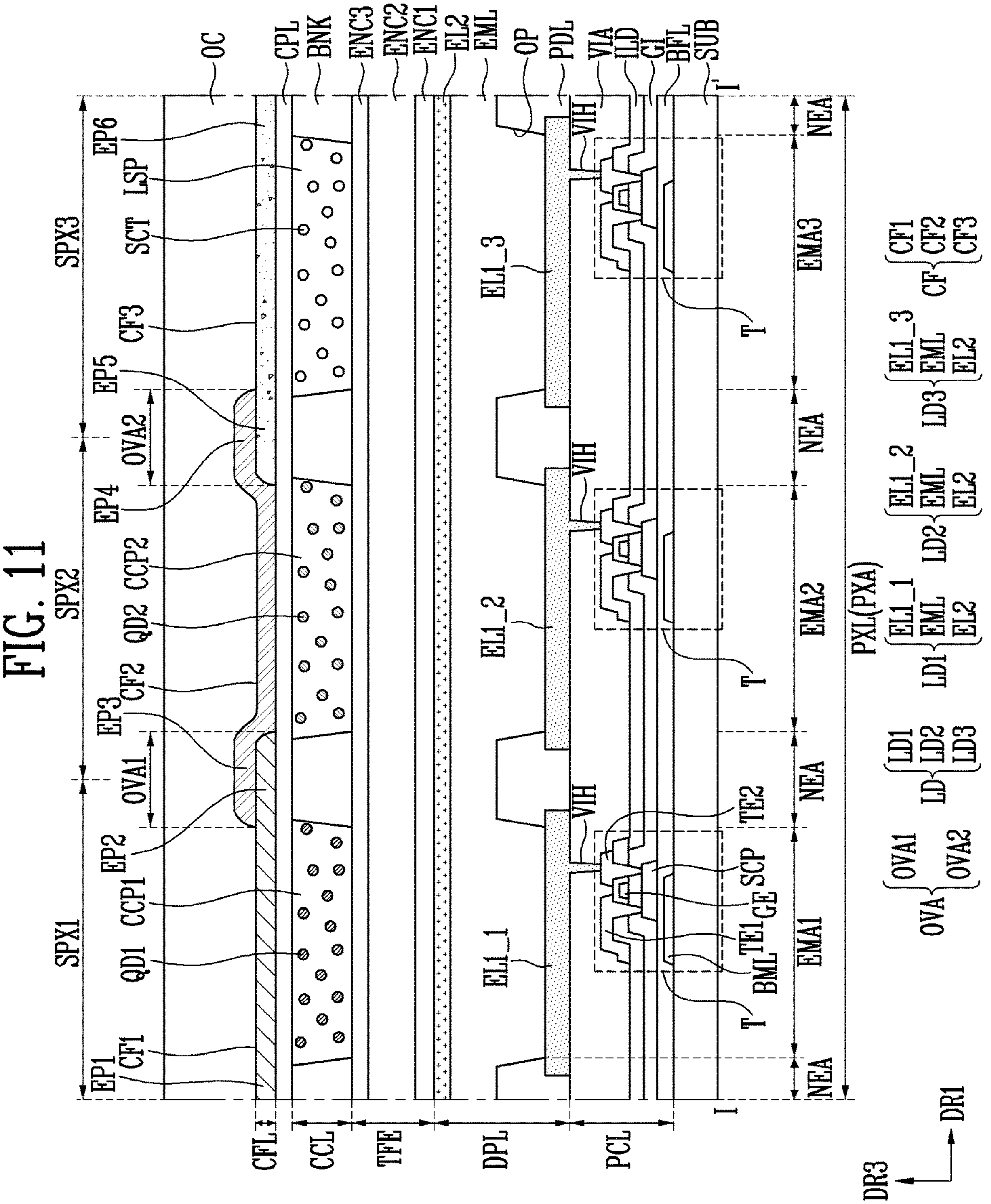
FIG. 11 illustrates a pixel in accordance with an embodiment, and is a schematic cross-sectional view corresponding to the line I-I' shown in FIG. 5.

FIG. 11 illustrates a pixel PXL in accordance with an embodiment, and is a schematic cross-sectional view corresponding to the line I-I' shown in FIG. 5.

In relation to an embodiment shown in FIG. 11, portions different from the portions of the above-described embodiment will be described to avoid redundancy.

Portions not particularly described in an embodiment shown in FIG. 11 follow those of the above-described embodiment. Identical reference numerals refer to identical components, and similar reference numerals refer to similar components.

Referring to FIGS. 1, 5, and 11, each of first, second, and third sub-pixels SPX1, SPX2, and SPX3 may include a substrate SUB, a pixel circuit layer PCL, a display element layer DPL, a thin film encapsulation layer TFE, a color conversion layer CCL, a color filter layer CFL, and an overcoat layer OC.

The substrate SUB may include a transparent insulating material to allow light to be transmitted therethrough. The substrate SUB may be a rigid substrate or a flexible substrate.

The pixel circuit layer PCL may be provided and/or formed on the substrate SUB. The pixel circuit layer PCL may include circuit elements (for example, a transistor T) and signal lines. Also, the pixel circuit layer PCL may include at least one insulating layer, for example, a buffer layer BFL, a gate insulating layer GI, an interlayer insulating layer ILD, and a via layer VIA.

The display element layer DPL may be provided and/or formed on the pixel circuit layer PCL. The display element layer DPL may include first, second, and third light emitting elements LD1, LD2, and LD3 and a pixel defining layer PDL.

The first light emitting element LD1 may include a (1-1)th electrode EL1_1, an emission layer EML, and a second electrode EL2. The second light emitting element LD2 may include a (1-2)th electrode EL1_2, the emission layer EML, and the second electrode EL2. The third light emitting element LD3 may include a (1-3)th electrode EL1_3, the emission layer EML, and the second electrode EL2.

The pixel defining layer PDL may be disposed on the (1-1)th electrode EL1_1, the (1-2)th electrode EL1_2, the (1-3)th electrode EL1_3, and the via layer VIA.

The pixel defining layer PDL may be located in a non-emission area NEA, expose one area or an area of the (1-1)th electrode EL1_1 in a first emission area EMA1, expose one area or an area of the (1-2)th electrode EL1_2 in a second emission area EMA2, and expose one area or an area of the (1-3)th electrode EL1_3 in a third emission area EMA3.

The emission layer EML may be provided and/or formed on the (1-1)th electrode EL1_1, the (1-2)th electrode EL1_2, and the (1-3)th electrodes EL1_3. The emission layer EML may be provided and/or formed even on a side and a top of the pixel defining layer PDL. The emission layer EML may be a common layer commonly provided in the first, second, and third sub-pixels SPX1, SPX2, and SPX3.

The emission layer EML may have a multi-layer thin film structure including a light generation layer for generating light. In an embodiment, the emission layer EML may emit blue-based light.

The second electrode EL2 may be provided and/or formed on the emission layer EML.

The thin film encapsulation layer TFE may be entirely provided and/or formed over the second electrode EL2.

The color conversion layer CCL may be provided and/or formed on the thin film encapsulation layer TFE.

The color conversion layer CCL may include a first color conversion pattern CCP1, a second color conversion pattern CCP2, a light scattering pattern LSP, and a bank BNK.

The first color conversion pattern CCP1 may be located on one surface or a surface of the thin film encapsulation layer TFE to correspond to the emission layer EML in the first sub-pixel SPX1, and include first color conversion particles QD1 for converting light, for example, blue-based light emitted from the emission layer EML into red-based light (or light of a specific color).

The second color conversion pattern CCP2 may be located on one surface or a surface of the thin film encapsulation layer TFE to correspond to the emission layer EML in the second sub-pixel SPX2, and include second color conversion particles QD2 for converting light, for example, blue-based light emitted from the emission layer EML into green-based light (or light of a specific color).

The light scattering pattern LSP may be located on one surface or a surface of the thin film encapsulation layer TFE to correspond to the emission layer EML in the third sub-pixel SPX3, and be a transparent layer (or transparent window) for allowing light, for example, blue-based light emitted from the emission layer EML to be transmitted therethrough as it is. The light scattering pattern LSP may include light scattering particles SCT for scattering blue-based light emitted from the emission layer EML in various directions.

The bank BNK may be disposed on one surface or a surface of the thin film encapsulation layer TFE to correspond to the pixel defining layer PDL. The bank BNK may be a structure defining a forming position of the first color conversion pattern CCP1, a forming position of the second color conversion pattern CCP2, and a forming position of the light scattering pattern LSP.

The bank BNK may include at least one light blocking material and/or at least one reflective material (or scattering material). In an embodiment, the bank BNK may include a transparent material (or substance). The transparent material may include, for example, polyimide resin, polyamide resin, and the like, but the disclosure is not limited thereto. In other embodiments, a reflective material layer may be separately provided and/or formed on the bank BNK so as to further improve the efficiency of light emitted from each of the first, second, and third sub-pixels SPX1, SPX2, and SPX3.

A capping layer CPL may be provided and/or formed on the color conversion layer CCL. The capping layer CPL may cover the color conversion layer CCL, thereby being used as a protective layer for protecting the color conversion layer CCL, but the disclosure is not limited thereto. The capping layer CPL may be an inorganic insulating layer including an inorganic material or an organic insulating layer including an organic material.

The color filter layer CFL may be provided and/or formed on the capping layer CPL.

The color filter layer CFL may include a first color filter CF1 corresponding to the first color conversion layer CCP1, a second color filter CF2 corresponding to the second color conversion layer CCP2, and a third color filter CF3 corresponding to the light scattering pattern LSP. For example, the first color filter CF1 may be a red color filter, the second color filter CF2 may be a green color filter, and the third color filter CF3 may be a blue color filter. However, the disclosure is not limited thereto.

In an embodiment, at least one of the first, second, and third color filters CF1, CF2, and CF3 may include a monomer containing fluorine, thereby having a refractive index smaller than a refractive index of the overcoat layer OC located on the top thereof. For example, each of the first, second, and third color filters CF1, CF2, and CF3 may include a monomer containing fluorine, thereby having a refractive index smaller than the refractive index of the overcoat layer OC.

In an embodiment, each of the first, second, and third color filters CF1, CF2, and CF3 may include resin and hollow particles dispersed inside the resin, thereby having a refractive index smaller than the refractive index of the overcoat layer OC located on the top thereof. The hollow particles may be hollow silica particles.

A non-emission area NEA may include a first overlapping area OVA1 in which the first color filter CF1 and the second color filter CF2 overlap each other. A second end portion EP2 of the first color filter CF1 and a first end portion EP3 of the second color filter CF2 may overlap each other in the first overlapping area OVA1. For example, the first end portion EP3 of the second color filter CF2 may be located on the second end portion EP2 of the first color filter CF1 in the first overlapping area OVAL.

A non-emission area NEA may include a second overlapping area OVA2 in which the second color filter CF2 and the third color filter CF3 overlap each other. A second end portion EP4 of the second color filter CF2 and a first end portion EP5 of the third color filter CF3 may overlap each other in the second overlapping area OVA2. For example, the second end portion EP4 of the second color filter CF2 may be located on the first end portion EP5 of the third color filter CF3 in the second overlapping area OVA2.

The overcoat layer OC may be disposed on the above-described color filter layer CFL.

The overcoat layer OC may be disposed on the color filter layer CFL to cover a lower member including the color filter layer CFL. In an embodiment, the overcoat layer OC may have a refractive index greater than a refractive index of the color filter layer CFL.

In each of the first and second overlapping layers OVA1 and OVA2, total reflection may occur due to a refractive difference at an interface between the overcoat layer OC and adjacent color filters which have a refractive index smaller than the refractive index of the overcoat layer OC and are disposed to overlap each other. Thus, while a portion of light advancing toward the non-emission area NEA (or the overlapping area OVA) in each of the first, second, and third sub-pixels SPX1, SPX2, and SPX3 is concentrated in a front direction of a corresponding sub-pixel, the front light emission efficiency of the sub-pixel can be improved.

As the color conversion layer CCL and the color filter layer CFL are disposed on the top of the thin film encapsulation layer TFE, light emitted from the emission layer EML of each of the first, second, and third sub-pixels SPX1, SPX2, and SPX3 is converted into light having excellent color reproducibility, thereby releasing the converted light, so that the light emission efficiency of each of the first, second, and third sub-pixels SPX1, SPX2, and SPX3 can be further improved.

In accordance with the disclosure, a color filter of each sub-pixel overlaps a color filter of an adjacent sub-pixel in the non-emission area, and an overcoat layer having a refractive index greater than a refractive index of the color filters is disposed on the top of the color filters, thereby guiding light released from a side of each pixel toward the front, using total reflection occurring due to a refractive index difference at an interface between the overlapping color filters and the overcoat layer. Thus, the front light emission luminance of the pixel can be increased.

In accordance with the disclosure, color filters overlapping each other in the non-emission area are used as a low refractive pattern, and thus a separate low refractive pattern is omitted. Accordingly, the manufacturing efficiency of the pixel and the display device comprising the same can be improved.

Example embodiments have been disclosed herein, and although terms are employed, they are used and are to be interpreted in a generic and descriptive sense only and not for purpose of limitation. In some instances, as would be apparent to one of ordinary skill in the art, features, characteristics, and/or elements described in connection with a given embodiment may be used singly or in combination with features, characteristics, and/or elements described in connection with other embodiments unless otherwise indicated. Accordingly, it will be understood by those of skill in the art that various changes in form and details may be made without departing from the scope of the disclosure and as set forth in the following claims.

What is claimed is:

1. A pixel comprising:

a first sub-pixel, a second sub-pixel, and a third sub-pixel each including an emission area and a non-emission area, wherein each of the first sub-pixel the second sub-pixel and the third sub-pixel includes:

a pixel circuit layer disposed on a substrate;

a first electrode disposed on the pixel circuit layer;

a pixel defining layer disposed in the non-emission area, the pixel defining layer including an opening disposed on the first electrode to expose an area of the first electrode corresponding to the emission area;

an emission layer disposed on the pixel defining layer;

a second electrode disposed on the emission layer;

a thin film encapsulation layer disposed over the second electrode;

a color filter disposed on the thin film encapsulation layer; and an overcoat layer disposed over the color filter, the overcoat layer has a refractive index greater than a refractive index of the color filter, a color filter of the second sub-pixel overlaps a color filter of each of the first sub-pixel and third sub-pixel in the non-emission area in a plan view, and the color filter includes a monomer containing fluorine or silica.

2. The pixel of claim 1, wherein the color filter has a refractive index in a range of about 1.4 to about 1.55, and the overcoat layer has a refractive index in a range of about 1.55 to about 1.7.

3. The pixel of claim 1, wherein the color filter of the second sub-pixel includes:

a first end portion disposed on the color filter of the first sub-pixel in the non-emission area; and a second end portion facing the first end portion and disposed on the color filter of the third sub-pixel, and a width of each of an overlapping area of the first end portion and the color filter of the first sub-pixel and an overlapping area of the second end portion and the color filter of the third sub-pixel is equal to or greater than a value obtained by subtracting about 0.6 μm from a width of the pixel defining layer and is equal to or less than a value obtained by adding about 0.2 μm to the width of the pixel defining layer.

4. The pixel of claim 3, wherein each of the first end portion and the second end portion of the color filter of the second sub-pixel has a height of about 1 μm or more in each of the overlapping areas.

5. The pixel of claim 4, wherein each of the first end portion and the second end portion has a side slope angle in a range of about 60 degrees to about 90 degrees.

6. The pixel of claim 1, wherein the substrate includes a silicon wafer substrate.

7. The pixel of claim 6, wherein the pixel circuit layer includes:

a gate insulating layer;

a gate electrode disposed on the gate insulating layer; and source and drain regions disposed at sides of the gate electrode in the substrate.

8. The pixel of claim 7, wherein each of the first sub-pixel, the second sub-pixel, and the third sub-pixel further includes:

a conductive pattern disposed on the pixel circuit layer;

a via layer disposed between the conductive pattern and the first electrode; and a via plug contacting the conductive pattern while penetrating the via layer, and the via plug is electrically connected to the first electrode.

9. The pixel of claim 1, wherein the color filter of the first sub-pixel includes one color filter among a red color filter, a green color filter, and a blue color filter, the color filter of the second sub-pixel includes another color filter among the red color filter, the green color filter, and the blue color filter, and the color filter of the third sub-pixel includes the other color filter among the red color filter, the green color filter, and the blue color filter.

10. The pixel of claim 9, wherein the substrate includes a transparent insulative material.

11. The pixel of claim 10, wherein an emission layer of the first sub-pixel emits light of a first color, an emission layer of the second sub-pixel emits light of a second color, different from the light of the first color, an emission layer of the third sub-pixel emits light of a third color, different from the light of the second color, and the emission layer of the first sub-pixel, the emission layer of the second sub-pixel, and the emission layer of the third sub-pixel are spaced apart from each other.

12. The pixel of claim 10, wherein each of the first sub-pixel, the second sub-pixel, and the third sub-pixel further includes:

a bank disposed on the thin film encapsulation layer in the non-emission area; and a color conversion pattern disposed on the thin film encapsulation layer in the emission area, the color conversion pattern being surrounded by the bank.

13. A display device comprising:

a substrate including an emission area and a non-emission area;

a pixel circuit layer disposed on the substrate;

a (1-1)th electrode, a (1-2)th electrode, and a (1-3)th electrode, disposed on the pixel circuit layer, the (1-1)th electrode, the (1-2)th electrode, and the (1-3)th electrode, spaced apart from each other;

a pixel defining layer disposed over the (1-1)th electrode, the (1-2)th electrode, and the (1-3)th electrode, the pixel defining layer including an opening exposing an area of each of the (1-1)th electrode, the (1-2)th electrode, and the (1-3)th electrode in the emission area;

an emission layer disposed on the (1-1)th electrode, the (1-2)th electrode, and the (1-3)th electrode exposed by the openings, a side of the pixel defining layer, and a top of the pixel defining layer;

a second electrode disposed on the emission layer;

a thin film encapsulation layer disposed over the second electrode;

a color filter layer disposed on the thin film encapsulation layer, the color filter layer including:

a first color filter corresponding to the (1-1)th electrode;

a second color filter corresponding to the (1-2)th electrode; and a third color filter corresponding to the (1-3)th electrode; and an overcoat layer disposed over the color filter layer, wherein the overcoat layer has a refractive index greater than a refractive index of each of the first color filter, the second color filter, and the third color filter, two color filters disposed adjacent to each other in the non-emission area overlap each other in a plan view, and the first color filter, the second color filter, and the third color filter include a monomer containing fluorine or silica.

14. The display device of claim 13, wherein each of the first color filter, the second color filter, and the third color filter has a refractive index in a range of about 1.4 to about 1.55, and the overcoat layer has a refractive index in a range of about 1.55 to about 1.7.

15. The display device of claim 13, wherein the second color filter includes:

a first end portion disposed on the first color filter in the non-emission area; and a second end portion facing the first end portion and disposed on the third color filter, and a width of each of an overlapping area of the first end portion and the first color filter and an overlapping area of the second end portion and the third color filter is about equal to or greater than a value obtained by subtracting about 0.6 μm from a width of the pixel defining layer and is about equal to or less than a value obtained by adding about 0.2 μm to the width of the pixel defining layer.

16. The display device of claim 15, wherein each of the first end portion and the second end portion of the second color filter has a height of about 1 μm or more in each of the overlapping areas.

17. The display device of claim 16, wherein each of the first end portion and the second end portion has a side slope angle in a range of about 60 degrees to about 90 degrees.

18. The display device of claim 13, wherein the substrate includes a silicon wafer substrate.

* * * * *